(12) United States Patent
Barkhouse et al.

(10) Patent No.: US 8,975,509 B2
(45) Date of Patent: Mar. 10, 2015

(54) PHOTOVOLTAIC DEVICES WITH MULTIPLE JUNCTIONS SEPARATED BY A GRADED RECOMBINATION LAYER

(75) Inventors: Aaron Barkhouse, Yorktown Heights, NY (US); Xihua Wang, Toronto (CA); Edward H. Sargent, Toronto (CA); Ghada Koleilat, Toronto (CA); Lukasz Brzozowski, Mississauga (CA)

(73) Assignee: The Governing Council of the University of Toronto, Toronto, Ontario (CA)

( * ) Notice: Subject to any disclaimer, the term of this patent is extended or adjusted under 35 U.S.C. 154(b) by 1051 days.

(21) Appl. No.: 13/022,350

(22) Filed: Feb. 7, 2011

(65) Prior Publication Data

US 2011/0297217 A1 Dec. 8, 2011

Related U.S. Application Data

(60) Provisional application No. 61/351,948, filed on Jun. 7, 2010.

(51) Int. Cl.
| | | |
|---|---|---|
| *H01L 31/00* | (2006.01) | |
| *H01L 31/0687* | (2012.01) | |
| *H01L 31/0352* | (2006.01) | |
| *H01L 51/42* | (2006.01) | |
| *H01L 31/0224* | (2006.01) | |

(52) U.S. Cl.
CPC .... *H01L 31/0687* (2013.01); *H01L 31/035218* (2013.01); *H01L 51/42* (2013.01); *H01L 31/022466* (2013.01); *H01L 31/022475* (2013.01); *Y02E 10/549* (2013.01)

USPC ............................................. 136/255

(58) Field of Classification Search
CPC ............ H01L 31/035218; H01L 31/0687; H01L 31/022466; H01L 31/022475
USPC ............................................. 136/255
See application file for complete search history.

(56) References Cited

U.S. PATENT DOCUMENTS

| | | | |
|---|---|---|---|
| 2008/0230120 A1* | 9/2008 | Reddy | 136/260 |
| 2009/0139558 A1 | 6/2009 | Yamazaki et al. | |

(Continued)

FOREIGN PATENT DOCUMENTS

| | | |
|---|---|---|
| EP | 1 478 030 A1 | 11/2004 |
| EP | 1 798 774 A2 | 6/2007 |

(Continued)

OTHER PUBLICATIONS

Föll, Helmut "Semiconductors," <https://web.archive.org/web/20020702003142/http://www.tf.uni-kiel.de/matwis/amat/semi_en/kap_2/backbone/r2_3_4.html> archived Jul. 2, 2002.*

(Continued)

*Primary Examiner* — Allison Bourke
(74) *Attorney, Agent, or Firm* — Kilpatrick Townsend & Stockton LLP

(57) ABSTRACT

A recombination layer with a gradient work function is provided which increases the power-conversion efficiency of multijunction photovoltaic devices by reducing the energy barrier to charge carriers migrating between pairs of photovoltaic junctions thereby facilitating the optimal recombination of opposing electron and hole currents generated when the photovoltaic is illuminated.

32 Claims, 13 Drawing Sheets

(56) References Cited

U.S. PATENT DOCUMENTS

| | | | |
|---|---|---|---|
| 2009/0165854 | A1 | 7/2009 | Yamazaki et al. |
| 2010/0096001 | A1* | 4/2010 | Sivananthan et al. ......... 136/249 |

FOREIGN PATENT DOCUMENTS

| | | |
|---|---|---|
| EP | 1 798 774 A3 | 6/2007 |
| JP | 2006-351721 A | 12/2006 |
| JP | 2008 270562 | 11/2008 |
| JP | 2009-152577 A | 7/2009 |
| JP | 2009-177158 A | 8/2009 |
| JP | 2009-533878 A | 9/2009 |
| JP | 2011 071278 | 4/2011 |
| WO | 2007/121252 A2 | 10/2007 |

OTHER PUBLICATIONS

Hiramoto, M., et al. "Effect of Thin Gold Interstitial-layer of Photovoltaic Properties of Tandem Organic Solar Cells," *Chem. Lett.* 19, 327-330 (1990).

Kim. J. Y. et al. Efficient Tandem Polymer Solar Cells Fabricated by All-Solution Processing, *Science* 317, 222-225 (2007).

King, R. R. et al. "40% efficient metamorphic GaInP/GaInAs/Ge multi-junction solar cells," *Appl. Phys. Lett.* 90, 183516 (2007).

Pattantyus-Abraham, A. G. et al. In "Depleted-heterojunction colloidal quantum dot solar Cells," 2010, *ACS Nano*, 4 (6), pp. 3374-3380.

Sargent, E. H., "Infrared photovoltaics made by solution processing," *Nature Photon.* 3, 325-331 (2009).

Yakimov, A. et al. "High photovoltage multiple-heterojunction organic solar cells incorporating interfacial metalic nanoclusters," *Appl. Phys. Lett.* 80, 1667-1669 (2002).

Yamaguchi, M., et al., "Multi-junction III-V solar cells: current status and future potential," *Solar Energy* 79, 78-85 (2005).

Kroger et al., "Role of the deep-lying electronic states of $MoO_3$ in the enhancement of hole-injection in organic thin films," Applied Physics Letters, 2009, vol. 95, No. 12, pp. 123301-1-123301-3.

Johnston, et al., "Schottky-quantum dot photovoltaics for efficient infrared power conversion," Applied Physics Letters, 2008, vol. 92, No. 15, pp. 151115-1-151115-3.

International Search Report and Written Opinion, PCT application No. PCT/US2011/024222, dated Oct. 19, 2011, 9 pages.

Office Action (English Translation) mailed Jul. 29, 2014 in Japanese Patent Application No. 2013-514164, 11 pages.

\* cited by examiner a Epitaxial Multi-junction PV

-- Prior Art -- b Organic Multi-junction PV

-- Prior Art -- c CQD Multi-junction PV

|       | $E_f$ (eV) | $E_v$ (eV) | $E_g$ (eV) | $E_c$ (eV) | σ (S/cm) | μ (cm²/Vs) | $n_0$ (cm⁻³) |
|-------|------------|------------|------------|------------|----------|------------|--------------|
| MoO₃  | 5.4        | 8.5        | 3.1        | 5.4        | $5.9 \times 10^{-5}$ | $1.5 \times 10^{-5}$ | $2.5 \times 10^{19}$ |
| ITO   | 4.8        |            |            |            |          |            |              |
| AZO   | 4.1        | 7.4        | 3.3        | 4.1        | 0.2      | 0.019      | $6.6 \times 10^{19}$ |
| TiO₂  | 4.1        | 7.7        | 3.7        | 4.0        | $1.4 \times 10^{-7}$ | $2.5 \times 10^{-5}$ | $3.5 \times 10^{16}$ |

$E_f$: work function
$E_v$: ionization energy
$E_g$: band gap
$E_c$: electron affinity
σ: conductivity
μ: mobility
$n_0$: electron free carrier density

PHOTOVOLTAIC DEVICES WITH MULTIPLE JUNCTIONS SEPARATED BY A GRADED RECOMBINATION LAYER

CROSS-REFERENCES TO RELATED APPLICATIONS

This patent application claims the benefit of U.S. Provisional Patent Application No. 61/351,948, filed Jun. 7, 2010, the contents of which are hereby incorporated herein by reference.

BACKGROUND OF THE INVENTION

1. Field of the Invention

This invention resides in the fields of multijunction photovoltaic cells and quantum dots.

2. Description of the Prior Art

Because the bandgap of colloidal quantum dots can be tuned based on their size to absorb distinct wavelengths of light [see Konstantatos, G. et al. *Nature* 442, 180-183 (2006); also Konstantatos, et al. *Nature Photon.* 1, 531-534 (2007); also Clifford, J. P. et al. *Nature Nanotech.* 4, 40-44 (2009); also Rauch, T. et al. *Nature Photon.* 3, 332-336 (2009); and also Sukhovatkin, V., et al., *Science* 324, 1542-1544 (2009)], colloidal quantum dots are an ideal light-absorbing material for photovoltaic devices with multiple junctions [see Sargent, E. H. *Nature Photon.* 3, 325-331 (2009); also Tang, J. et al. *Adv. Mater.* 22, 1398-1402 (2010); also Gur, I. et al. *Science* 31, 462-465 (2005); also Kamat, P. V. *J. Phys. Chem. C* 112, 18737-18753 (2008); also Luther, J. M. et al. *Nano Lett.* 8, 3488-3492 (2008); also Arango, A. C., et al., *Nano Lett.* 9, 860-863 (2008); also Choi, J. J. et al. *Nano Lett.* 9, 3749-3755 (2009); and also Debnath, R. et al. *J. Am. Chem. Soc.* 132, 5952-5953 (2010)]. Each photovoltaic junction in a colloidal-quantum-dot-based multijunction photovoltaic device can be uniquely optimized to absorb those wavelengths of light which result in the highest power-conversion efficiency. The power-conversion efficiencies of these multijunction photovoltaics can theoretically increase beyond that of single junction solar cells. As described by Sargent, E. H., in "Infrared photovoltaics made by solution processing," *Nature Photon.* 3, 325-331 (2009), the theoretical power-conversion efficiency of photovoltaic devices increases when a series of a single junction photovoltaics, which each have a theoretical power-conversion efficiency of 31%, are stacked into multi-junction architectures including tandem photovoltaic architectures, which have a theoretical power-conversion efficiency of 42%, and triple-junction photovoltaic architectures, which have a theoretical power-conversion efficiency of 49%.

One of the challenges in realizing the theoretical power-conversion efficiencies of multijunction photovoltaics is the high-energy barrier preventing the recombination of opposing electron and hole currents from adjacent photovoltaic junctions. In multijunction epitaxial photovoltaics, researchers reduce this high-energy barrier with an extremely thin tunnel junction of degenerately-doped p-type and n-type materials wherein the valence band on the p-side is energetically aligned with the conduction band on the n-side and the depletion region is sufficiently thin that electrons and holes can tunnel from one side of the layer to the other [See Yamaguchi, M., et al., *Solar Energy* 79, 78-85 (2005); and King, R. R. et al. *Appl. Phys. Lett.* 90, 183516 (2007)]. However, tunnel junctions are not compatible with colloidal-quantum-dot-based photovoltaics because of the tunnel junction's sequential combination of p-type and n-type materials and the processing constraints of colloidal quantum dots. Although the aforementioned high-energy barrier in organic photovoltaics has been reduced by interposing a layer of traps and metal nanoparticles between the electron transport layer and the hole transport layer [See Hiramoto, M., et al. *Chem. Lett.* 19, 327-330 (1990); Yakimov, A. et al. *Appl. Phys. Lett.* 80, 1667-1669 (2002); Kim. J. Y. et al. *Science* 317, 222-225 (2007)], the non-aqueous processing constraints for colloidal quantum dots and related devices preclude the implementation of the aqueous-based strategy suitable for organic photovoltaics.

What is needed in the art are compositions and methods for optimizing the recombination of electron and hole currents from adjacent photovoltaic junctions in colloidal-quantum-dot-based multijunction photovoltaic devices. Surprisingly, the present invention meets these and other needs.

SUMMARY OF THE INVENTION

It has now been discovered that the limitations of colloidal-quantum-dot-based multijunction photovoltaics as noted above can be significantly reduced or overcome by interposing a recombination region with a gradient work function between adjacent pairs of photovoltaic junctions. The recombination region, which is also referred herein to as the graded recombination layer, includes a transparent and conductive heavily-doped deep-work function oxide on one side that ohmically contacts the light-absorbing layer of one photovoltaic junction in a photovoltaic stack, while the other side of the recombination region is a transparent and conductive lightly-doped shallow work function oxide that ohmically contacts the electron-accepting layer of a second photovoltaic junction in the photovoltaic stack. In certain embodiments, in between the heavily-doped deep work function oxide and the lightly-doped shallow work function oxide is a transparent and conductive oxide interlayer whose work function is between those of the deep work function oxide and the shallow work function oxide. In certain embodiments, an additional deep work function oxide is interposed between the deep-work function oxide and the light-absorbing layer of the adjacent photovoltaic junction. In general, the recombination region provides a progressive transition in work function from the conductive hole-accepting layer in ohmic contact with the light-absorbing layer of one photovoltaic junction, where the work function is greatest, to the transparent and conductive electron-accepting layer in ohmic contact with the electron-accepting layer of an adjacent photovoltaic junction, where the work function is smallest. Photogenerated electrons and holes are biased to travel in particular directions as a consequence of the gradient in work function and the orientation of the recombination region relative to the two neighboring photovoltaic junctions. Photogenerated electrons from the light-absorbing layer of one photovoltaic junction move through the recombination region toward the electron-accepting layer of the second photovoltaic junction, while photogenerated holes from the electron-accepting layer of the second photovoltaic junction move through the recombination region toward the light-absorbing layer of the first photovoltaic junction. The gradient in work function produces an increase in power conversion efficiency of multijunction photovoltaics by providing a low-energy-pathway for the recombination of electron and hole currents from pairs of photovoltaic junctions.

BRIEF DESCRIPTION OF THE FIGURES

FIG. 2b is an electronic energy band-diagram of a colloidal quantum dot multijunction photovoltaic with an embodiment of the graded recombination layer within the scope of the present invention.

FIG. 3a shows the J-V, i.e. current-voltage, characteristics of single junction and double junction photovoltaics devices under 975 nm monochromatic light illumination with an irradiation intensity of 12 mW/cm$^2$. The single junction photovoltaic shows Jsc=1.84 mA/cm$^2$, Voc=0.46 V, FF=54%, and PCE=3.75%; the double junction photovoltaic with ITO/TiO$_2$ as recombination layer shows Jsc=0.98 mA/cm$^2$, Voc=0.73 V, FF=42%, and PCE=2.46%; the double junction photovoltaic with ITO/AZO/TiO$_2$ as graded recombination layer (GRL) shows Jsc=1.47 mA/cm$^2$, Voc=0.86 V, FF=47%, and PCE=4.87%. FIG. 3b shows the intensity-dependent characterization of a typical double junction photovoltaic with an embodiment of the graded recombination layer within the scope of the present invention. The experimental data are plotted with black square dots. The abbreviation "Jsc" refers to the short-circuit current density. The abbreviation "Voc" refers to the open-circuit voltage. The abbreviation "FF" refers to the fill factor. The abbreviation "PCE" refers to the photoconversion efficiency.

FIG. 4a shows the conductivity of the individual metal-oxide materials in one embodiment of the grader recombination layer within the scope of the present invention. The inset shows the resistance (black square dots) of titanium dioxide films with different lengths and widths. The slope of the fitted linear curve is used to calculate the conductivity of titanium dioxide films. FIG. 4b shows the transmission spectrum of one embodiment of the graded recombination layer within the scope of the present invention.

FIG. 7a shows a schematic of a tandem solar cell and scanning electron micrograph of the device in cross-section; FIG. 7b shows a schematic of a PbS colloidal quantum dot tandem solar cells having quantum-confined bandgaps of 1.6 eV and 1.0 eV; FIG. 7c shows a band diagram of colloidal quantum dot based tandem solar cells at equilibrium; FIG. 7d shows short-circuit conditions; FIG. 7e shows open-circuit conditions.

FIG. 8 shows the current matching in colloidal quantum dot tandem cells.

FIG. 10 shows the electrical and optical characterization of GRL materials.

DETAILED DESCRIPTION OF ILLUSTRATIVE EMBODIMENTS OF THE INVENTION

Definitions

Figure 1:
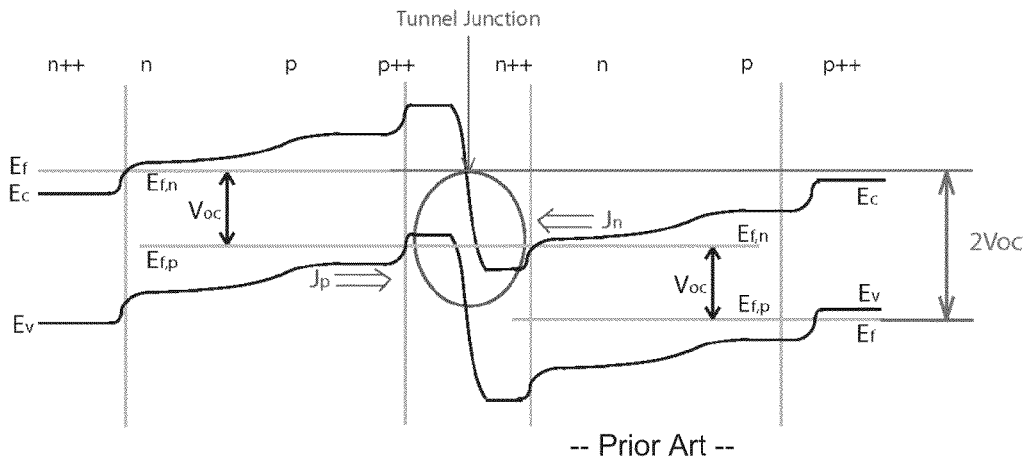
FIG. 1 includes electronic energy band diagrams describing the relative electronic energy levels of the constituent components of A) a prior art epitaxial multijunction photovoltaic with a tunnel junction in FIG. 1a; B) a prior art organic multijunction photovoltaic with an organic recombination layer in FIG. 1b; and C) a colloidal-quantum-dot-based multijunction photovoltaic with an embodiment of the graded recombination layer within the scope of the present invention in FIG. 1c.
Figure 1:
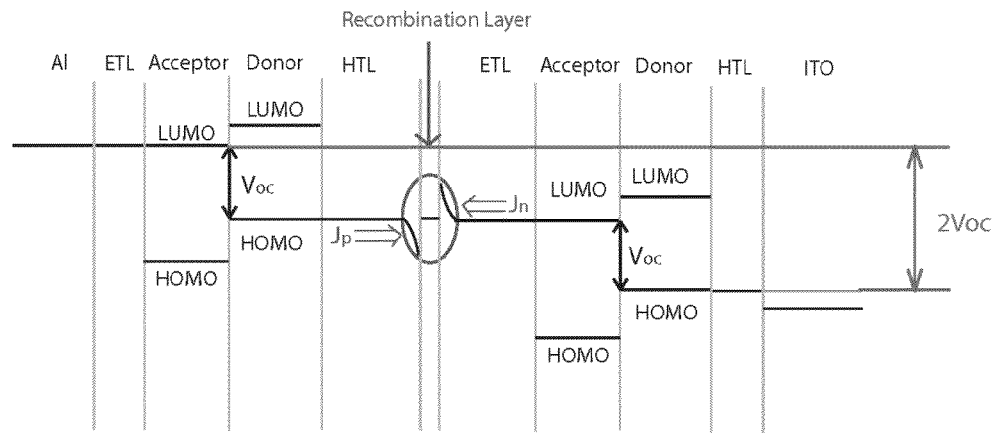
Figure 1:
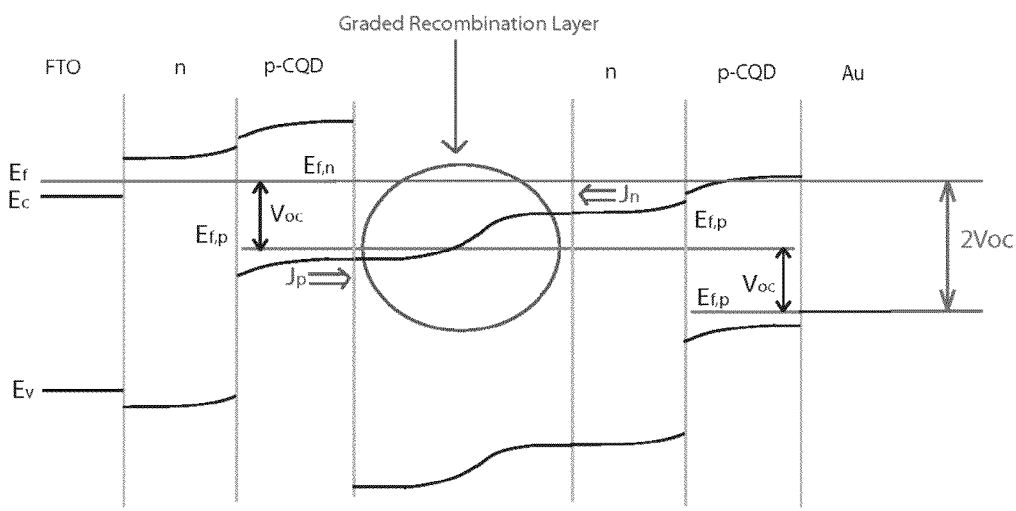

As used herein, the term "photovoltaic" refers to a semiconductor that absorbs light energy and converts this light energy into electrical energy, e.g. photo-generated electrons and photo-generated holes.

As used herein, the term "semiconductor" refers to a material in which the Fermi-level, i.e. the work function, is between the conduction band and the valence band.

As used herein, the term "n-type" refers to a semiconductor that is doped to possess an excess of negative charge carriers, i.e. electrons. For example, when a pentavalent dopant atom, e.g. phosphorus, arsenic, or antimony, substitutes for a tetravalent atom in a semiconductor, e.g. silicon, the dopant introduce an additional negative charge into the semiconductor as a consequence of the dopant atom's greater valency.

As used herein, the term "p-type" refers to a semiconductor that is doped so that there is an excess of positive charge carriers, i.e. holes. For example, when a trivalent dopant atom, e.g. aluminum or boron, is substituted for a tetravalent atom in a semiconductor, e.g. silicon, the dopant atom introduces an additional positive charge into the semiconductor as a consequence of the dopant atom's smaller valency.

As used herein, the terms "lightly-doped" refer to a semiconductor that is only minimally doped so that the electronic structure is more similar to an insulator than it is to a conductor.

As used herein, the terms "heavily-doped" refer to a semiconductor that is doped to such an extent that the electronic structure is more similar to a conductor than to an insulator. For example, the doping values of $2.5\times10^{19}$ and $6.6\times10^{19}$ $cm^{-3}$ for $MoO_3$ and AZO are associated with heavily doped materials. Also, the doping value of $3.5\times10^{16}$ $cm^3$ for $TiO_2$ is associated with light doping.

As used herein, the phrase "oxide" refers to an oxygen-containing chemical compound. For example, oxide includes, but is not limited to, silicon oxide, titanium dioxide, aluminum oxide, and molybdenum oxide.

As used herein, the phrase "metal oxide" refers to a compound that includes at least one metal atom and at least one oxygen atom. The metal oxides of the present invention can be naturally occurring or synthetically prepared. Representative examples of the metal oxides of the present invention include, but are not limited to, tin oxide, fluorine-doped tin oxide, indium tin oxide, titanium dioxide, zinc oxide, aluminum-doped zinc oxide, and molybdenum oxide.

As used herein, the phrase "work function" refers to the minimum energy required to completely remove an electron from a solid material. The level of the work function of one material is substantially larger than the work function of another material when the difference between the work functions is at least 0.5 eV.

As used herein, the term "depleted" refers to the relative absence of free electrons and free holes at an electrical heterojunction when not illuminated.

As used herein the term "substantially depleted" refers to the characterization of the region(s) adjacent to a heterojunction and denotes that the charge density in the region(s) is orders of magnitude less than that of the metal side of a Schottky junction. In certain heterojunction regions of the invention, the charge density is three or more orders of magnitude less than the charge density of conducting metals, and in many of these, the charge density is four or more, five or more, or six or more orders of magnitude less. Particularly effective results can be achieved when the depleted charge density is on the n-type electron accepting layer side of the junction. In many embodiments of the invention, a range of charge density in the depleted region is about $1\times10^{12}$ $cm^{-1}$ to about $1\times10^{18}$ $cm^{-1}$, or alternatively about $1\times10^{14}$ $cm^{-1}$ to about $1\times10^{17}$ $cm^{-1}$, or as a further alternative about $1\times10^{15}$ $cm^{-1}$ to about $1\times10^{16}$ $cm^{-1}$.

To achieve a depleted heterojunction by use of materials of different bandgap magnitudes on the two sides of the junction, effective results in many cases can be achieved with a bandgap difference (i.e., the difference between the bandgap magnitude on one side of the junction and the bandgap magnitude on the other side of the junction) of at least about 1.5 eV, or within the range of from about 1.5 eV to about 5 eV, or even more effectively within the range of from about 2 eV to about 5 eV. With an n-type electron-accepting layer on one side of the junction and p-type light-absorbing nanoparticles on the other, the bandgap of greater magnitude will reside in the n-type electron-accepting layer.

As used herein, the phrase "depletion region" refers to a type of electrical junction of the electron-accepting and the light-absorbing semiconductor layers in a photovoltaic junction.

As used herein, the phrase "recombination region" refers to a material with a gradient work function located between pairs of photovoltaic junctions.

As used herein, the term "gradient" refers to a progressive and directional change in the value of a property, e.g. work function. The gradient can include transitions in the value of a property that are either smooth or stepwise.

As used herein, and with respect to the phrase "graded recombination layer," the grading refers to the progression of work functions from the deep work function of the layer which makes ohmic contact to the p-type light-absorbing layer of one of a pair of photovoltaic junctions to the shallow work function of the layer which makes ohmic contact to the electron acceptor layer of the other of a pair of photovoltaic junctions.

As used herein, the phrase "ohmic contact" refers to a type of electrical connection to a semiconductor that is characterized by a current-voltage curve which is linear and symmetric.

As used herein, the phrase "charge carriers" refers to photo-generated electron and hole currents.

As used herein, the term "nanoparticle" refers to a composition of matter with physical dimensions on the order of nanometers. For example, a spherical nanoparticle has a diameter that can range from about one nanometer to about one hundred nanometers. Preferably, a spherical nanoparticle has a diameter that can range from about one nanometer to about fifty nanometers. More preferably, a spherical nanoparticle has a diameter that can range from about one nanometer to about twenty five nanometers. Example nanoparticles include, but are not limited to: metal nanoparticles, e.g. Cu, Au, Ag, Ni, Pd, and Pt; binary nanoparticles, e.g. PbS, CdS, and CdSe quantum dots, core-shell quantum dots, core-shell-shell quantum dots, or quantum onions; metal oxides nanoparticles, e.g. ZnO, $TiO_2$, and organic nanoparticles, e.g. carbon nanotubes, fullerenes, organic aggregates, and micelles. Nanoparticles may optionally include surface-stabilizing ligands, e.g. mercapto compounds, thiols, carboxylate-containing ligands.

As used herein, the phrase "tin oxide" refers to the inorganic oxide having the empirical formula, $SnO_2$.

As used herein, the phrase "indium tin oxide" refers to a solid solution of the inorganic oxides indium(III) oxide, having the empirical formula $In_2O_3$, and tin(IV) oxide, having the formula $SnO_2$. In some embodiments, the relative ratio of $In_2O_3$ to $SnO_2$ ranges from about 8:1 to about 10:1 by weight. In some preferred embodiments, the relative ratio of $In_2O_3$ to $SnO_2$ is about 9:1.

As used herein, the phrase "titanium dioxide" refers to the inorganic oxide having the empirical formula, $TiO_2$. Titanium dioxide includes all the polymorphs associated with titanium dioxide, including, but not limited to, rutile, anatase, and brookite.

As used herein, the phrase "aluminum-doped zinc oxide" refers to the inorganic oxide, zinc oxide, having the empirical formula, ZnO, which is further doped with aluminum atoms.

Persons of ordinary skill in the art will recognize that many metal oxides exist with non-stoichiometric ratios of metal to oxygen. For instance, titanium dioxide exists with up to 10% and sometimes more oxygen vacancies.

General

In one aspect, the present invention provides a multijunction energy-converting device that includes first and second electrodes and a photovoltaic stack in electrical contact with said first and second electrodes. In certain aspects, the photovoltaic stack includes a plurality of photovoltaic junctions. In related aspects, each said photovoltaic junction includes an electron-accepting semiconductor layer and a light-absorbing semiconductor layer having a substantially larger work function than said electron-accepting semiconductor layer. In one embodiment, said photovoltaic junctions are separated by a recombination region comprising a transparent and conductive hole-accepting layer in ohmic contact with said light-absorbing semiconductor layer of said first photovoltaic junction, a transparent and conductive electron-accepting layer in ohmic contact with said electron-accepting semiconductor layer of said second photovoltaic junction. In certain embodiments, an additional transparent and conductive interlayer is disposed between, and having a work function between work functions of, said hole-accepting and electron-accepting layers. Said recombination region forms a gradient in work function from said transparent and conductive hole-accepting layer in ohmic contact with light-absorbing semiconductor layer of said first photovoltaic junction to said transparent and conductive electron-accepting layer in ohmic contact with said electron-accepting semiconductor layer of said second photovoltaic junction. In certain aspects, said recombination region has a thickness within one order of magnitude of the sum of the Debye lengths of all layers of said recombination region.

Figure 2:
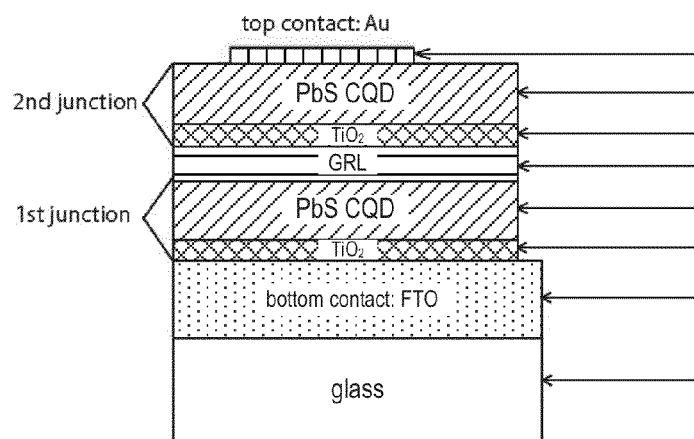
FIG. 2 includes, on the left side of FIG. 2a, a schematic of a colloidal quantum dot multijunction photovoltaic with an embodiment of the graded recombination layer within the scope of the present invention, and on the right side of FIG. 2a, a scanning electron microscope (SEM) image of the cross-section of a colloidal quantum dot multijunction photovoltaic with an embodiment of the graded recombination layer within the scope of the present invention.
Figure 2:
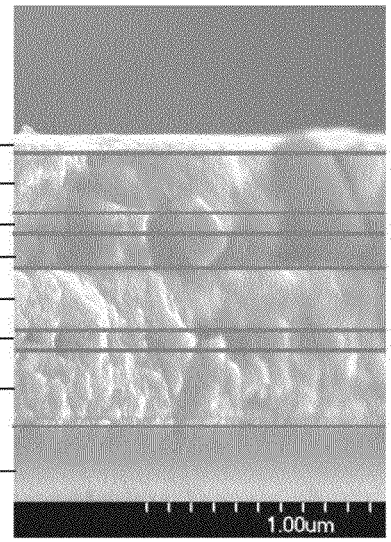
Figure 2:
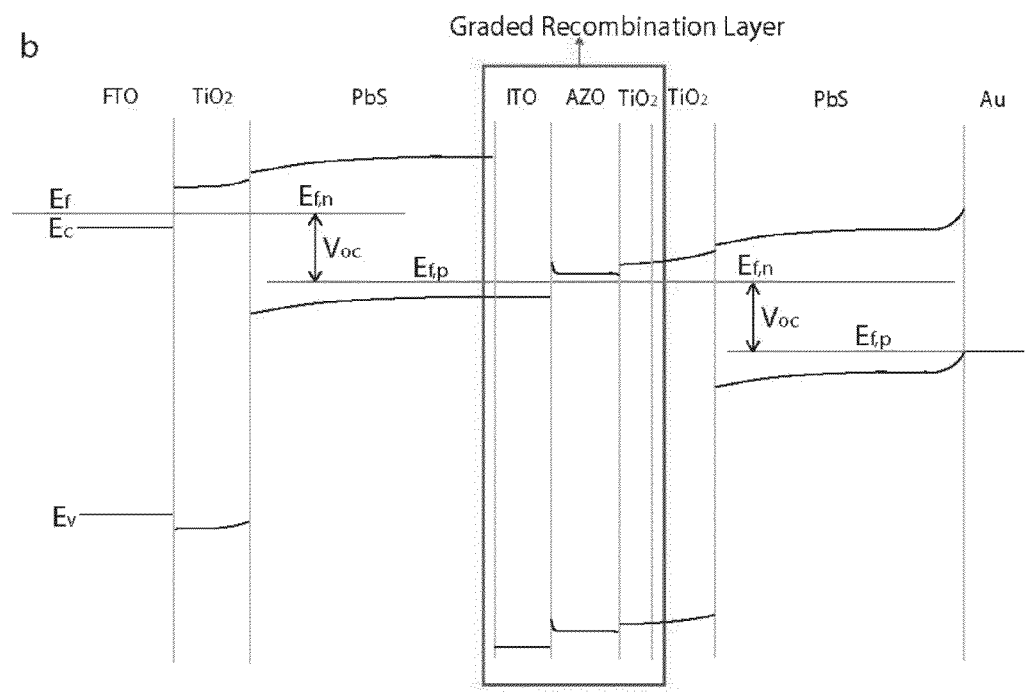
Figure 3:
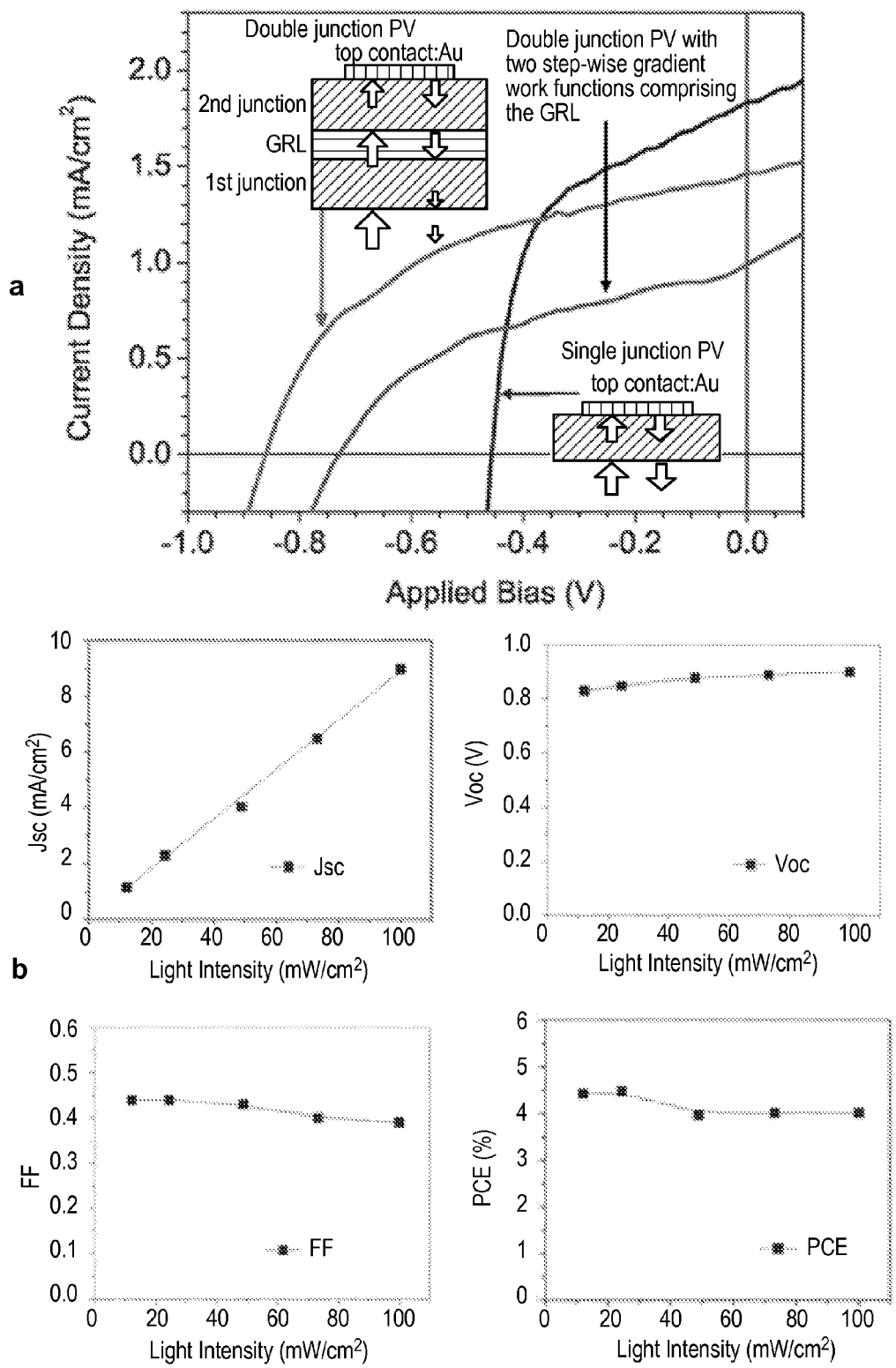
FIG. 3 shows plots of the optoelectronic performance of single junction and tandem colloidal-quantum-dot-based photovoltaic devices.

In a related aspect, the first and second electrodes are in electrical contact with the outer-most top and bottom surfaces of the photovoltaic stack. The first and second electrodes can be connected to each other to complete an electrical circuit in series with the photovoltaic stack. For example, in the tandem photovoltaic architecture illustrated in FIG. 2a, which includes two photovoltaic junctions vertically-stacked and in electrical contact, the second electrode, e.g. gold, is in direct electrical contact with the outer-most top layer of the top-stacked photovoltaic junction, e.g. lead sulfide colloidal quantum dots, and, similarly, the first electrode, fluorine doped tin oxide (FTO), is in direct electrical contact with the outer-most surface of the bottom layer of the bottom-stacked photovoltaic junction, e.g. titanium dioxide. The first electrode in many cases is a light-transmitting electrode, and examples include, but are not limited to, aluminum oxide, zinc oxide, indium tin oxide (ITO), fluorine-doped tin oxide (FTO), molybdenum (Mo/MoSe$_3$), fluorine-doped tin dioxide (F:SnO$_2$), indium tin oxide/poly(3,4-ethylene dioxythiophene (ITO/PEDOT), n-type aluminum gallium arsenide (Al/n+-GaAs), or silver-containing indium tin oxide (Ag(ITO)). The second electrode in many cases is either nickel, lithium fluoride, aluminum, platinum, palladium, silver, gold, or copper, or alloys of two or more of these metals, such as alloys of silver, gold, and copper. Examples of the second electrode include, but are not limited to, aluminum doped zinc oxide (ZnO/Al), p-type silver gallium arsenide (p+-GaAs/Ag) and n-type silicon fluorine doped tin oxide (n+a-Si/F:SnO$_2$). One example of a combination of electrode materials is fluorine-doped tin oxide as the first electrode and gold as the second electrode.

In another related aspect, each photovoltaic junction includes an electron-accepting semiconductor layer and a light-absorbing semiconductor layer which has a substantially larger work function than the electron-accepting semiconductor layer. Examples of the electron-accepting semiconductor layer include, but are not limited to, titanium dioxide, zinc oxide, niobium oxide, cadmium sulfide, phenyl-$C_{61}$-butyric acid methyl ester (PCBM), n-type aluminum gallium indium phosphide (n-AlInGaP), n-type gallium arsenide (n-GaAs), amorphous silicon-germanium (a-SiGe) or amorphous silicon (a-Si). Other examples of the electron-accepting semiconductor layer include, but are not limited to, transparent and conductive metal oxides capable of accepting electrons generated at the light-absorbing semiconductor layer. Examples of the light-absorbing semiconductor layer include, but are not limited to, copper indium gallium diselenide (CIGS), copper gallium diselenide (CGS), poly[2,1,3-benzothiadiazole-4,7-diyl[4,4-bis(2-ethylhexyl)-4H-cyclopenta[2,1-b:3,4-b']dithiophene-2,6-diyl]] (PCPDTBT), poly-3(hexylthiophene) (P3HT), p-type gallium arsenide (p-GaAs), amorphous silicon-germanium (a-SiGe), amorphous silicon (a-Si), nanoparticles and colloidal quantum dots such as lead sulfide colloidal quantum dots. In some aspects, the work function of the light-absorbing semiconductor is substantially larger than the work function of the electron-accepting semiconductor layer when the difference in magnitude between the respective work functions is at least 0.5 eV. In a related aspect, when the difference between the bandgap magnitude of the electron-accepting and light-absorbing semiconductor layers is at least about 1.5 eV, or within the range of from about 1.5 eV to about 5 eV, or even more effectively within the range of from about 2 eV to about 5 eV, the heterojunction therebetween is substantially depleted of free electrons and free holes when not illuminated.

In a related aspect, the recombination region is physically located between pairs of photovoltaic junctions. As described in FIG. 1c, the heavily-doped deep-work function layer of the graded recombination layer ohmically contacts the p-type light-absorbing colloidal quantum dot layer of one of the pair of photovoltaic junctions. The lightly-doped shallow-work function layer of the graded recombination layer ohmically contacts the n-type electron-accepting layer of the other of the pair of photovoltaic junctions. An intervening layer having a work function level that is intermediate between the work function level of the heavily-doped deep-work function layer and the lightly-doped shallow-work function layer is physically located between the heavily-doped deep-work function layer and the lightly-doped shallow-work function layer. Electrons photogenerated at the lead sulfide colloidal quantum dots of one of the pair of photovoltaic junctions migrate through the recombination region in the direction of the electron-accepting semiconductor layer of the other of the pair of photovoltaic junctions. Holes photogenerated at the lead sulfide colloidal quantum dots of one of the pair of photovoltaic junctions migrate through the recombination region in the direction of the light-absorbing semiconductor layer of the other of the pair of photovoltaic junctions. Within the recombination region, the photogenerated electrons and holes recombine.

The thickness of a particular layer of the recombination region is within one order of magnitude of the Debye length of that particular layer. Accordingly, the thickness of the recombination region is within one order of magnitude of the sum of the Debye lengths of all layers of said recombination region. The Debye thickness is the thickness of the electric double layer which appears on the surface on an object. The first layer typically includes ions that associate through chemical interactions with the surface. The second layer typically includes ions that associate through coulombic interactions with the aforementioned first layer ions.

In one aspect, the layers of the graded recombination region are, independently in each instance, about 1 nm, 2 nm, 3 nm, 5 nm, 7 nm, 10 nm, 12 nm, 15 nm, 17 nm, 20 nm, 22 nm, 25 nm, 27 nm, 30 nm, 32 nm, 35 nm, 40 nm, 45 nm, 50 nm, 55 nm, or 60 nm in thickness. In a related aspect, each layer of the graded recombination region is, independently in each instance, about 1 nm, 10 nm, 20 nm, 30 nm, 40 nm, 50 nm, or 60 nm. In another aspect, the molybdenum trioxide layer is about 10 nm thick. In yet another aspect, the layers molybdenum trioxide, ITO, AZO, and TiO$_2$, are 10 nm, 50 nm, 50 nm, and 40 nm in thickness, respectively.

In another aspect, the present invention provides a recombination region with a gradient work function that decreases from a value within about 0.2 eV of the work function of the light-absorbing semiconductor layer to a value within about 0.2 eV of the electron-absorbing semiconductor layer. In a related aspect, the gradient work function is a stepwise gradient having at least two steps. In some other aspects, the gradient work function is a stepwise gradient having exactly three steps.

Work functions can be obtained by Ultraviolet photoelectron spectroscopy (UPS). The work functions of $MoO_3$ was observed to be about 5.4 eV; for ITO the work function observed was about 4.8 eV; for AZO and $TiO_2$, the work function observed was to 4.1 eV. Electron affinities of AZO and $TiO_2$ were 4.1 eV and 4.0 eV, respectively. Band edges are obtained by combining ionization potentials from UPS with bandgaps from optical absorption. For example, AZO and TiO2 were found to have electron affinities of 4.1 eV and 4.0 eV respectively. The values can be confirmed by cyclic voltammetry, which provides the electron affinities directly through an alternate measurement.

In some aspects, the recombination region includes a plurality of sublayers, and each sublayer has a uniform work function. In this aspect of the present invention, the sublayers are arranged such that the work function levels of the sublayers decrease toward the electron-accepting semiconductor layer.

In another aspect, the recombination region includes a plurality of sublayers. Examples of these sublayers include, but are not limited to, indium tin oxide, aluminum-doped zinc oxide, and titanium dioxide. Another example of these sublayers includes, but is not limited to, indium tin oxide and titanium dioxide. A further example includes, but is not limited to, a single material with a non-uniform and gradient work function.

In one embodiment, the recombination region within the scope of the present invention includes a heavily-doped deep-work function n-type indium tin oxide in ohmic contact with the light-absorbing layer of one of a pair of photovoltaic junctions. In some other embodiments, a layer of molybdenum trioxide is interposed between the heavily-doped deep work function layer, e.g. n-type indium tin oxide, and the light absorbing semiconductor layer. See FIG. 7. In some embodiments, the molybdenum trioxide is in ohmic contact with both the heavily-doped deep work function layer and the light absorbing semiconductor layer. The heavily-doped deep-work function n-type indium tin oxide also forms an electrical junction with an intermediate-work function aluminum doped zinc oxide. The intermediate-work function aluminum doped zinc oxide is located between the heavily-doped deep-work function n-type indium tin oxide and a lightly-doped titanium dioxide of the recombination region. The lightly-doped titanium dioxide of the recombination region is also in ohmic contact with the electron-accepting layer of the other of a pair of photovoltaic junctions.

In another embodiment, the recombination region includes a heavily-doped deep-work function n-type indium tin oxide in ohmic contact with the light-absorbing layer of one of a pair of photovoltaic junctions. The heavily-doped deep-work function n-type indium tin oxide also forms an electrical junction with an intermediate-work function aluminum doped zinc oxide. The intermediate-work function aluminum doped zinc oxide is located between the heavily-doped deep-work function n-type indium tin oxide and a lightly-doped titanium dioxide layer. The lightly-doped titanium dioxide of the recombination region is also in ohmic contact with the light-absorbing layer of the other of a pair of photovoltaic junctions.

In another embodiment of the present invention, the recombination region includes an undoped zinc oxide (i-ZnO) in ohmic contact with an n-type zinc oxide (n-ZnO) which is in ohmic contact with an indium tin oxide (ITO) layer.

In another embodiment, the recombination region includes a molybdenum trioxide in contact with a heavily-doped deep-work function n-type indium tin oxide. The heavily-doped deep-work function n-type indium tin oxide also forms an electrical junction with an intermediate-work function aluminum doped zinc oxide. The deep-work function n-type indium tin oxide is located between the molybdenum trioxide and the aluminum doped zinc oxide of the recombination region.

In yet another embodiment, the recombination region includes an aluminum doped zinc oxide in ohmic contact with an n-type indium tin oxide. The n-type indium tin oxide is located between the aluminum zinc oxide and the molybdenum trioxide layer.

In another aspect, the light-absorbing semiconductor layer comprises p-type light-absorbing nanoparticles such as, but not limited to, colloidal quantum dots. Colloidal quantum dots suitable for use with the present invention include any nanoparticle that can absorb visible and near-infrared light. Examples of colloidal quantum dots suitable for use with the present invention include, but are not limited to, PbS, PbSe, PbSSe, CdS, CdSe, and CdTe. In a related aspect, the p-type light-absorbing nanoparticles are metal chalcogenide colloidal quantum dots. In certain aspects, the p-type light-absorbing nanoparticles are lead chalcogenide colloidal quantum dots.

One example of a combination of an electron-accepting semiconductor layer and a light-absorbing semiconductor layer is when the electron-accepting semiconductor layer is titanium dioxide and the light-absorbing semiconductor layer includes lead chalcogenide colloidal quantum dots.

The photovoltaic stack can be prepared with a varying number of photovoltaic junctions. In one aspect, the photovoltaic stack includes a minimum of two and a maximum of fifteen of the photovoltaic junctions. In another aspect, the photovoltaic stack contains a minimum of two and a maximum of five of the photovoltaic junctions. In a further aspect, the photovoltaic stack contains exactly two of the photovoltaic junctions. In a further related aspect, the photovoltaic stack contains exactly three of the photovoltaic junctions.

Each light-absorbing semiconductor layer of the photovoltaic junctions can be tuned to absorb light of wavelengths which, when absorbed, result in the optimal power-conversion efficiency. In one aspect, the light-absorbing semiconductor layer of a first photovoltaic junction in the photovoltaic stack absorbs light of a first wavelength band and the light-absorbing semiconductor layer of a second photovoltaic junction in the photovoltaic stack absorb light at wavelengths outside the first wavelength band. In another aspect, the light-absorbing semiconductor layer of a first photovoltaic junction in the photovoltaic stack has an exiton peak at about 760 nm (1.6 eV) and the light-absorbing semiconductor layer of a second photovoltaic junction in the photovoltaic stack has an exiton peak of about 1240 nm (1.0 eV). In another aspect, the photovoltaic stack contains p-type light-absorbing nanoparticles that absorb light of wavelengths that are different from the wavelengths of light absorbed by p-type light-absorbing nanoparticles of any of the other photovoltaic junctions in the photovoltaic stack.

In another aspect, the electron-accepting semiconductor layer and the light-absorbing semiconductor layer, optionally, have bandgaps that are sufficiently different in magnitude such that the electrical junction therebetween is substantially depleted of free electrons and free holes when the junction is not illuminated.

In another aspect, the bandgap of the electron-accepting semiconductor layer is greater than the bandgap of the light-absorbing semiconductor layer by at least about 1.5 eV. In a related aspect, the bandgap of the electron-accepting semiconductor layer is greater than the bandgap of the light-absorbing semiconductor layer by from about 1.5 eV to about 5 eV.

In another aspect, the light-absorbing semiconductor layer of one of the pair of adjacent photovoltaic junctions absorbs light with wavelengths between about 400 nm and about 950 nm and the light-absorbing semiconductor layer of the other of the pair of adjacent photovoltaic junctions absorbs light with wavelengths between about 400 nm and about 1600 nm.

In another aspect, the electron-accepting semiconductor layer comprises an n-type metal oxide and the light-absorbing semiconductor layer comprises p-type nanoparticles having a substantially larger work function than the n-type metal oxide, and at least one side of the electrical junction therebetween is substantially depleted of free electrons and free holes when the junction is not illuminated. In another aspect, the electron-accepting semiconductor layer is a transparent and conductive metal oxide with a shallow work function. In certain instances, the electron-accepting semiconductor layer is selected from titanium dioxide, e.g. $TiO_2$, zinc oxide, e.g. ZnO, or niobium oxide, $Nb_2O_5$.

In another aspect, the specific conductance of the recombination region is greater than 1 Siemens/cm².

The materials and devices of the present invention can be prepared by a variety of synthetic and preparatory methods including, but not limited to, solution methods, sol-gel methods, chemical vapor deposition methods, electron-beam epitaxy methods, clean-room techniques, sputtering methods, and gas-phase transfer reactions.

Representative values of the physical parameters of materials suitable for use with the present invention are provided in Tables 1-6 below.

TABLE 1

Materials Suitable for Use with the Present Invention

| Material | Work function | Bandgap | electron affinity | Other important physical properties: doping |
|---|---|---|---|---|
| First Electrode, e.g. F: $SnO_2$ | 4.5 eV | | | |
| Electron-accepting layer, e.g. $TiO_2$ | 4.2 eV | 3.3 eV | 3.9 eV | $1*10^{16} cm^{-3}$ |
| Light-absorbing layer, e.g. PbS CQD | 4.8 eV | 1.3 eV | 3.8 eV | $1*10^{16} cm^{-3}$ |
| Layer 1 of GRL, e.g. ITO | 4.8 eV | 3.3 eV | Greater than 4.8 eV | $1*10^{20} cm^{-3}$ |
| Layer 2 of GRL, e.g. AZO | 4.3 eV | 3.3 eV | 4.0 eV | $1*10^{18} cm^{-3}$ |
| Layer 3 of GRL, e.g. $TiO_2$ | 4.15 eV | 3.3 eV | 3.9 eV | $1*10^{16} cm^{-3}$ |
| Second electrode, e.g. Au | 5.1 eV | — | — | — |

TABLE 2

Materials Suitable for a CIGS GRL Device

| Component | Work function | Bandgap | Electron affinity | Doping |
|---|---|---|---|---|
| First electrode, e.g. Mo/$MoSe_3$ | 4.6 eV/5.0 eV | NA | NA | NA |
| Photovoltaic junction 1: electron-accepting layer, e.g. $CuInSe_2$ | 5.0 eV | 1.0 eV | 4.2 eV | $1*10^{16} cm^{-3}$ |
| Photovoltaic junction 1: Light-absorbing layer, e.g. CdS | 4.4 eV | 2.4 eV | 4.3 eV | $1*10^{18} cm^{-3}$ |
| Layer 1 of GRL, e.g. i-ZnO | 4.3 eV | 3.3 eV | 4.1 eV | $1*10^{17} cm^{-3}$ |
| Layer 2 of GRL, e.g. n-ZnO | 4.1 eV | 3.3 eV | 4.1 eV | $6*10^{19} cm^{-3}$ |
| Layer 3 of GRL, e.g. ITO | 4.8 eV | 3.1 eV | NA | $1*10^{21} cm^{-3}$ |
| Photovoltaic junction 2: electron-accepting layer, e.g. $CuGaSe_2$ | 5.0 eV | 1.7 eV | 3.5 eV | $1*10^{16} cm^{-3}$ |
| Photovoltaic junction 2: Light-absorbing layer, e.g. CdS | 4.4 eV | 2.4 eV | 4.3 eV | $1*10^{18} cm^{-3}$ |
| Second electrode, e.g. n-ZnO/Al | 4.1 eV/4.2 eV | NA | NA | NA |

TABLE 3

Materials Suitable for a Colloidal Quantum Dot GRL Device

| Component | Work function | Bandgap | Electron affinity | Doping |
|---|---|---|---|---|
| First electrode, e.g. F: $SnO_2$ | 4.5 eV | 3 eV | NA | NA |
| Photovoltaic junction 1: electron-accepting layer, e.g. $TiO_2$ | 4.3 eV | 3.3 eV | 4.1 eV | $1*10^{17} cm^{-3}$ |
| Photovoltaic junction 1: Light-absorbing layer, e.g. PbS CQD | 5.0 eV | 1.6 eV | 3.6 eV | $2*10^{16} cm^{-3}$ |
| Layer 1 of GRL (e.g.. $MoO_3$) | 5.4 eV | 3.1 eV | 5.4 eV | $4*10^{19} cm^{-3}$ |
| Layer 2 of GRL (e.g.. ITO) | 4.8 eV | 3.1 eV | NA | $1*10^{21} cm^{-3}$ |
| Layer 3 of GRL (e.g.. AZO) | 4.1 eV | 3.3 eV | 4.1 eV | $6*10^{19} cm^{-3}$ |
| Photovoltaic junction 2: electron-accepting layer, e.g. $TiO_2$ | 4.1 eV | 3.7 eV | 4.0 eV | $3*10^{16} cm^{-3}$ |
| Photovoltaic junction 2: Light-absorbing layer, e.g. PbS CQD | 4.8 eV | 1 eV | 4.0 eV | $2*10^{16} cm^{-3}$ |
| Second electrode, e.g. Au | 5.1 eV | NA | NA | NA |

TABLE 4

Materials Suitable for an Organic GRL Device

| Component | Work function | Bandgap | Electron affinity | Doping |
|---|---|---|---|---|
| First electrode, e.g. ITO/PEDOT | 4.8 eV/5.0 eV | 3.1 eV | NA | NA |
| Photovoltaic junction 1: Light-absorbing layer, e.g. PCPDTBT | 4.9 eV | 1.4 eV | 3.5 eV | NA |
| Photovoltaic junction 1: electron-accepting layer, e.g. PCBM | 4.3 eV | 2.8 eV | 4.3 eV | NA |
| Layer 1 of GRL, e.g. AZO | 4.1 eV | 3.3 eV | 4.1 eV | $6*10^{19}\,cm^{-3}$ |
| Layer 2 of GRL, e.g. ITO | 4.8 eV | 3.1 eV | NA | $1*10^{21}\,cm^{-3}$ |
| Layer 3 of GRL, e.g. MoO$_3$ | 5.4 eV | 3.1 eV | 5.4 eV | $4*10^{19}\,cm^{-3}$ |
| Photovoltaic junction 1: Light-absorbing layer, e.g. P3HT | 5.1 eV | 1.9 eV | 3.2 eV | NA |
| Photovoltaic junction 2: electron-accepting layer, e.g. PCBM | 4.3 eV | 2.8 eV | 4.3 eV | NA |
| Second electrode, e.g. Al | 4.2 eV | NA | NA | NA |

As used herein, "PEDOT" refers to Poly(3,4-ethylenedioxythiophene). As used here, "PCBM" refers to phenyl-C$_{61}$-butyric acid methyl ester, a fullerene derivative also known as [6,6]-phenyl-C$_{61}$-butyric acid methyl ester. As used herein, "P3HT" refers to a type of a polythiophene also known as poly(3-hexylthiophene) or poly(3-hexylthiophene-2,5-diyl). As used here, "PCPDTBT" refers to an organic semiconductor also known as Poly[2,1,3-benzothiadiazole-4,7-diyl[4,4-bis(2-ethylhexyl)-4H-cyclopenta[2,1-b:3,4-b']dithiophene-2,6-diyl]].

TABLE 5

Material Suitable for Use with a AlGaInP GRL Device

| Component | Work function | Bandgap | Electron affinity | Doping |
|---|---|---|---|---|
| First electrode, e.g. Al/n+-GaAs | 4.2 eV/4.0 eV | NA | NA | NA |
| Photovoltaic junction 1: n semiconductor layer, e.g. n-AlInGaP | 3.9 eV | 1.9 eV | 3.9 eV | $1*10^{18}\,cm^{-3}$ |
| Photovoltaic junction 1: p semiconductor layer, e.g. p-AlInGaP | 5.6 eV | 1.9 eV | 3.9 eV | $1*10^{17}\,cm^{-3}$ |
| Layer 1 of GRL (e.g.. MoO3) | 5.4 eV | 3.1 eV | 5.4 eV | $4*10^{19}\,cm^{-3}$ |
| Layer 2 of GRL (e.g.. ITO) | 4.8 eV | 3.1 eV | NA | $1*10^{21}\,cm^{-3}$ |
| Layer 3 of GRL (e.g.. AZO) | 4.1 eV | 3.3 eV | 4.1 eV | $6*10^{19}\,cm^{-3}$ |
| Photovoltaic junction 2: n semiconductor layer, e.g. n-GaAs | 4.0 eV | 1.4 eV | 4.0 eV | $1*10^{18}\,cm^{-3}$ |
| Photovoltaic junction 2: p semiconductor layer, e.g. p-GaAs | 5.2 eV | 1.4 eV | 4.0 eV | $1*10^{17}\,cm^{-3}$ |
| Second electrode, e.g. p+-GaAs/Ag | 5.4 eV/4.2 eV | NA | NA | NA |

TABLE 6

Materials Suitable for Use with an a-Si GRL Device

| Component | Work function | Bandgap | Electron affinity | Doping |
|---|---|---|---|---|
| First electrode, e.g. Ag/ITO | 4.2 eV/4.8 eV | NA | NA | NA |
| Photovoltaic junction 1: p semiconductor layer, e.g. a-SiGe | 5.0 eV | 1.0 eV | 4.0 eV | $1*10^{18}\,cm^{-3}$ |
| Photovoltaic junction 1: i semiconductor layer, e.g. a-SiGe | 4.5 eV | 1.0 eV | 4.0 eV | $1*10^{16}\,cm^{-3}$ |
| Photovoltaic junction 1: n semiconductor layer, e.g. SiGe | 4.0 eV | 1.0 eV | 4.0 eV | $1*10^{18}\,cm^{-3}$ |
| Layer 1 of GRL, e.g. AZO | 4.1 eV | 3.3 eV | 4.1 eV | $6*10^{19}\,cm^{-3}$ |
| Layer 2 of GRL, e.g. ITO | 4.8 eV | 3.1 eV | NA | $1*10^{21}\,cm^{-3}$ |
| Layer 3 of GRL, e.g. MoO3 | 5.4 eV | 3.1 eV | 5.4 eV | $4*10^{19}\,cm^{-3}$ |
| Photovoltaic junction 2: p semiconductor layer, e.g. a-Si | 5.4 eV | 1.7 eV | 3.7 eV | $1*10^{18}\,cm^{-3}$ |
| Photovoltaic junction 2: i semiconductor layer, e.g. a-Si | 4.5 eV | 1.7 eV | 3.7 eV | $1*10^{16}\,cm^{-3}$ |
| Photovoltaic junction 2: n semiconductor layer, e.g. a-Si | 3.7 eV | 1.7 eV | 3.7 eV | $1*10^{18}\,cm^{-3}$ |
| Second electrode, e.g. n+ a-Si/F: SnO2 | 3.7 eV/4.5 eV | 3 eV | NA | NA |

EXAMPLE 1

This example illustrates the synthesis and purification of colloidal quantum dots suitable for use with the present invention.

Chemicals.

Lead oxide (PbO) (99.9%), oleic acid (90%), bis(trimethylsilyl)sulphide (TMS, synthesis grade), 1-octadecene (90%), 3-mercaptopropionic acid (99%), terpineol, Triton-X and all solvents (anhydrous grade) were obtained from Sigma-Aldrich. Gold (Au) sputtering target (99.99%), Titanium dioxide ($TiO_2$) sputtering target and Indium tin oxide (ITO) sputtering target were obtained from Kurt J. Lesker, Inc. Fluorine-doped tin oxide-coated glass substrates (Pilkington TEC 15) were obtained from Hartford Glass.

Colloidal Quantum Dot Synthesis and Purification.

TMS (0.18 g, 1 mol) was added to 1-octadecene (10 mL), which had been dried and degassed by heating to 80° C. under vacuum for 24 hours. A mixture of oleic acid (1.34 g, 4.8 mmol), PbO (0.45 g, 2.0 mmol), and 1-octadecene (14.2 g, 56.2 mmol) was heated to 95° C. under vacuum for 16 hours and then placed under Ar. The flask temperature was increased to 120° C. and the TMS/octadecene mixture was injected. After injection, the temperature dropped to approximately 95° C., and the flask was allowed to cool to 36° C. The nanocrystals were precipitated with 50 mL of distilled acetone and centrifuged under ambient conditions. After discarding the supernatant, the precipitate was redispersed in toluene. The nanocrystals were precipitated again with 20 mL of acetone, then centrifuged for 5 min, dried, and then finally dispersed in toluene (~200 mg·$mL^{-1}$).

The PbS nanocrystals were then brought into a $N_2$-filled glove box. They are precipitated twice with methanol, and then finally redispersed at 50 mg $mL^{-1}$ in octane.

EXAMPLE 2

This example illustrates the optical characterization of a PbS colloidal quantum dot film.

Figure 5:
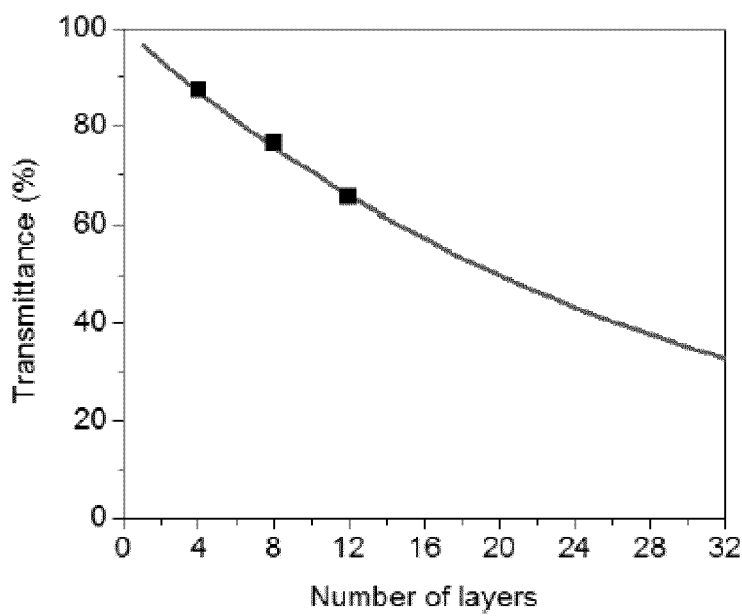
FIG. 5 shows the transmission spectrum of PbS colloidal quantum dot films at the wavelength of 975 nm.

The multilayer spincoating method provides 30 nm thick of PbS colloidal quantum dot film after deposit each layer. Single junction photovoltaic devices with 4 layers, 8 layers, and 12 layers of spin-coated PbS colloidal quantum dot film were fabricated with the exception of a gold top contact. The transmission spectrum of these devices was obtained by using a UV-Vis-IR scan photospectrometer with an integrating sphere. The transmitted light from the same device substrate was used as the reference for 100% transmittance. The transmittance of PbS film is extracted at the wavelength of 975 nm. In FIG. 5, the transmittance as the function of number of layers is plotted. The experimental data, which is represented by black square dots, is fit with the optical equation, Beer's law, as illustrated from the red curve. From the plot, each junction is obtained, This plot illustrates that each junction, 8 layers of a spin-coated PbS colloidal quantum dot film, of a double junction device, absorbs almost equal amount of incident light at 975 nm, which is around 33% of incident light.

EXAMPLE 3

This example illustrates the conductivity measurement of $TiO_2$.

Figure 4:
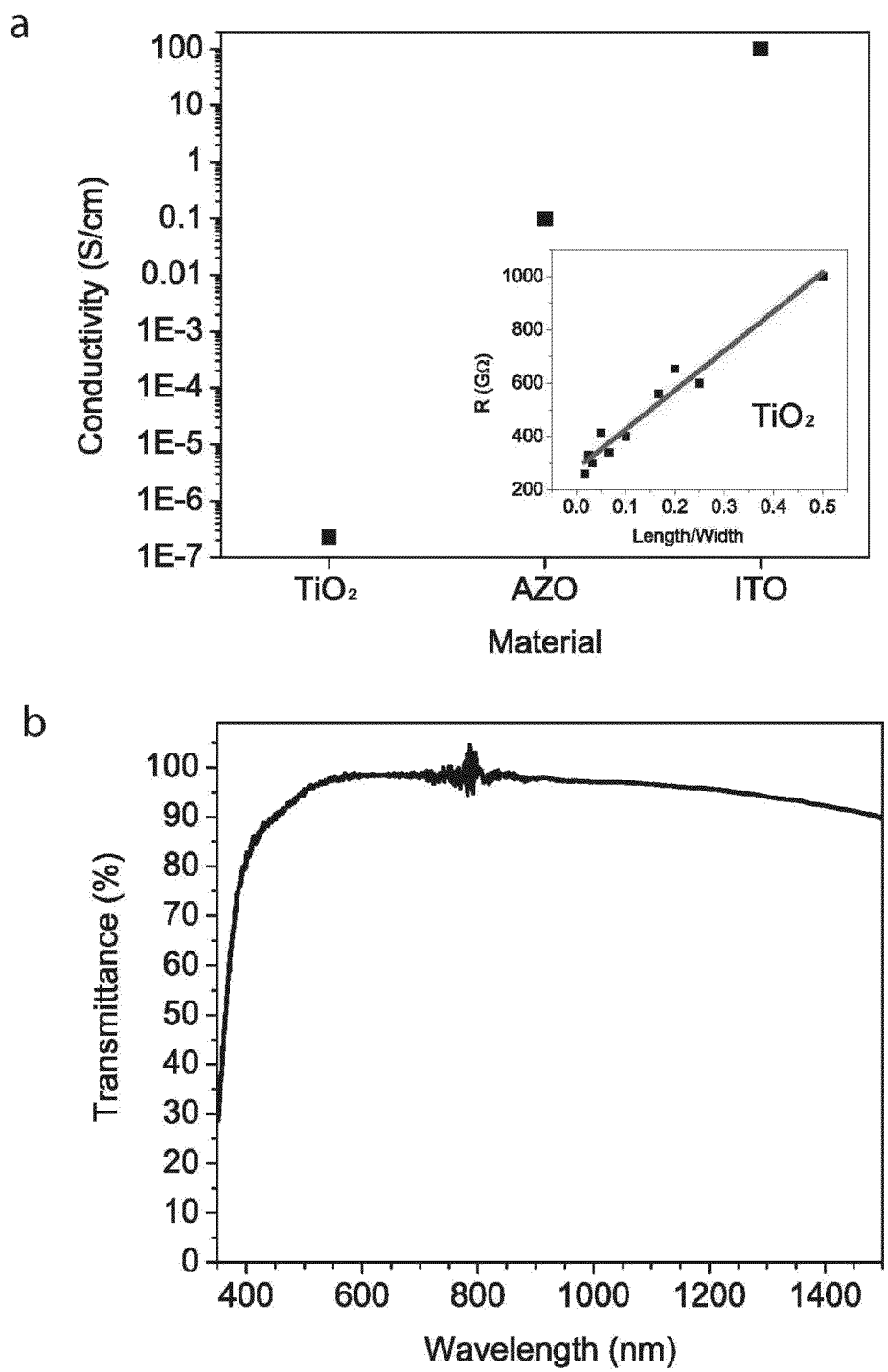
FIG. 4 shows the electrical and optical characterization of an embodiment of the graded recombination layer, and its constituent components, within the scope of the present invention.
Figure 6:
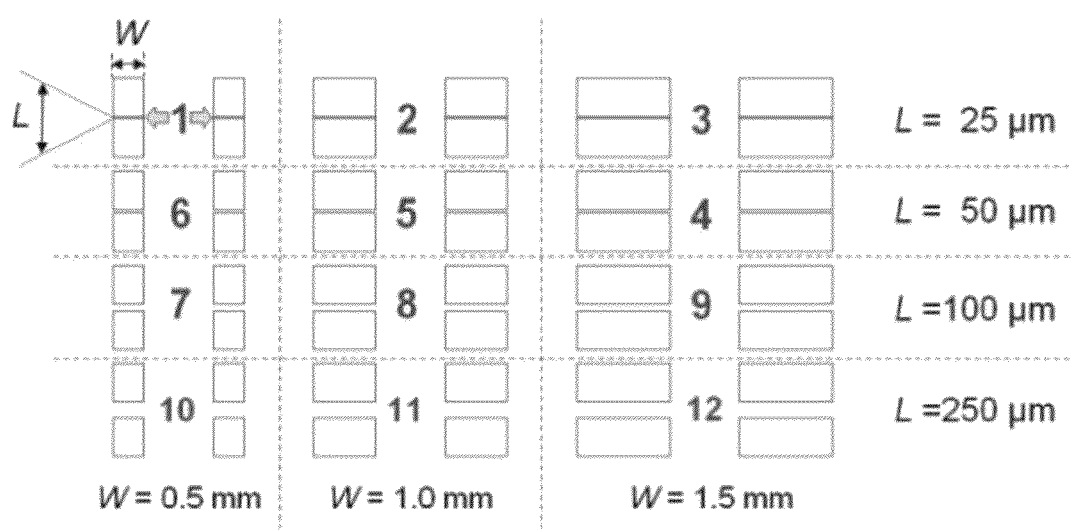
FIG. 6 shows the pattern of the Ag electrodes on a TiO$_2$ film which are useful for conductivity measurements of the TiO$_2$ film.
Figure 7A:
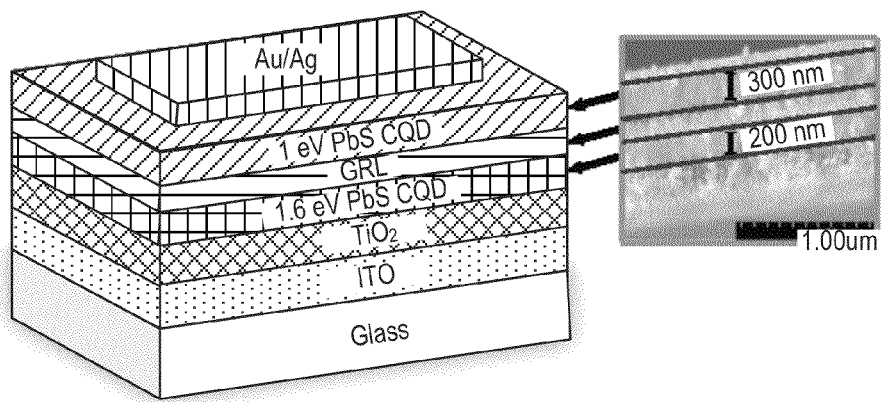
FIG. 7a-e shows a colloidal quantum dot (CQD) based tandem solar cells.
Figure 7B:
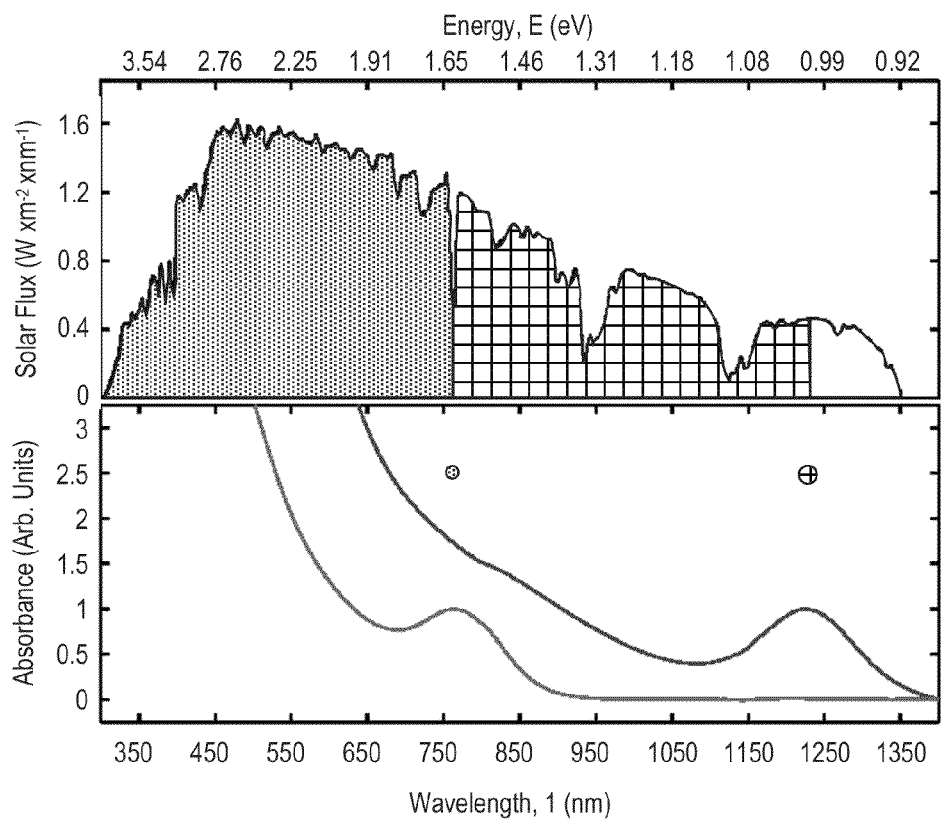
Figure 7C:
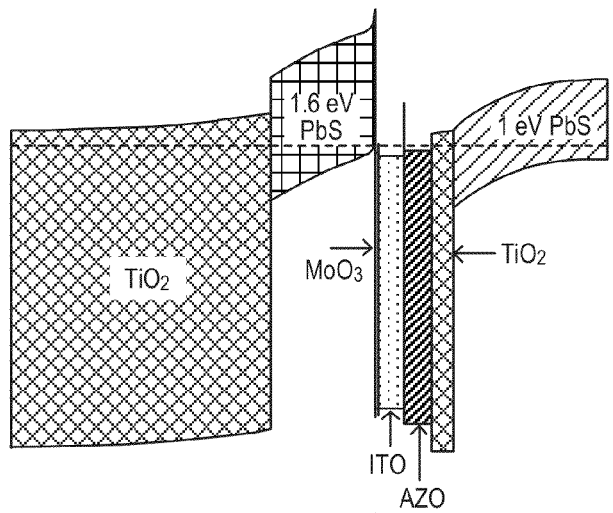
Figure 7D:
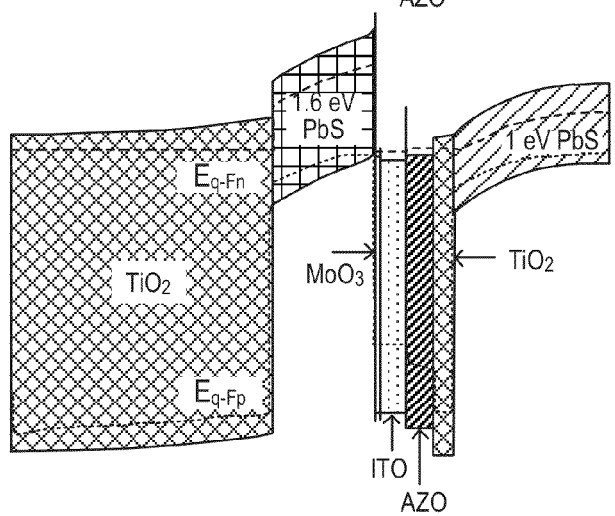
Figure 7E:
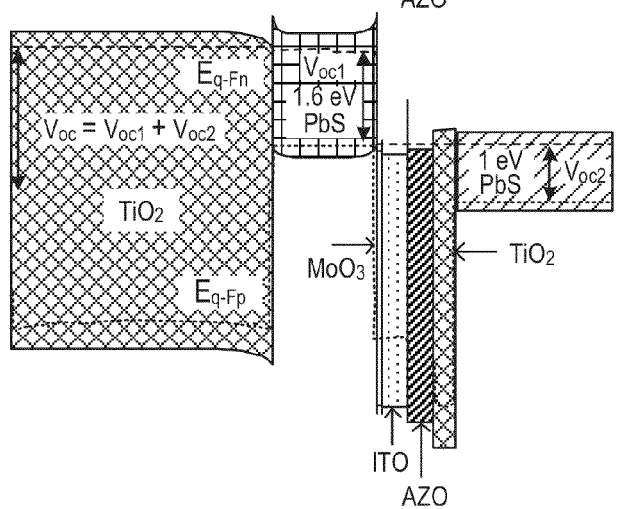
Figure 7E:
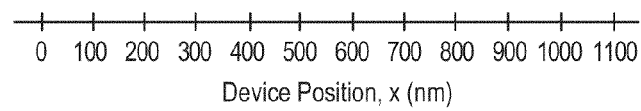
Figure 8A:
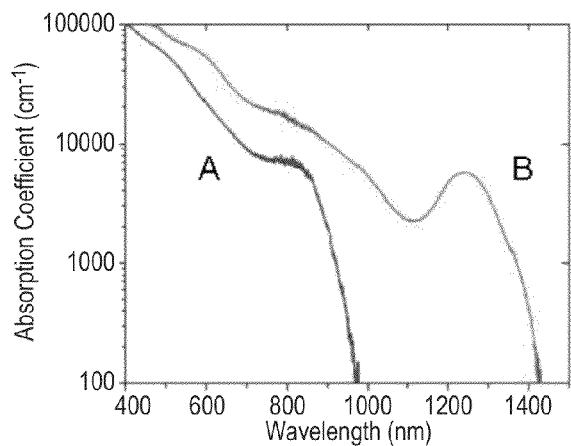
FIG. 8a shows the measured absorption coefficients of the 1.6 eV bandgap, line A, and the 1.0 eV bandgap, line B, films.
Figure 8B:
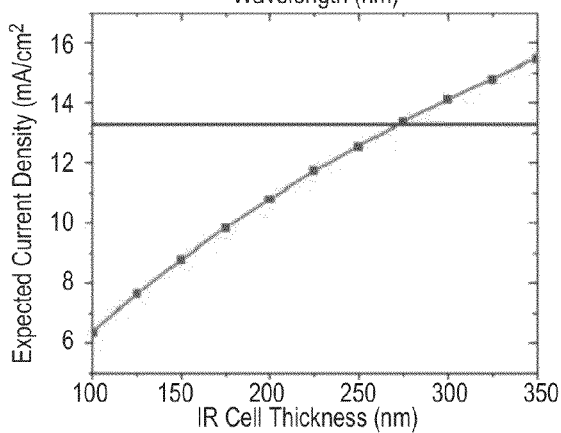
FIG. 8b shows the predicted current densities for the small-bandgap cell as a function of its thickness. Double-pass absorption due to the reflective top contact is taken into account. Current matching is achieved in the thickness range of 250-300 nm.
Figure 8C:
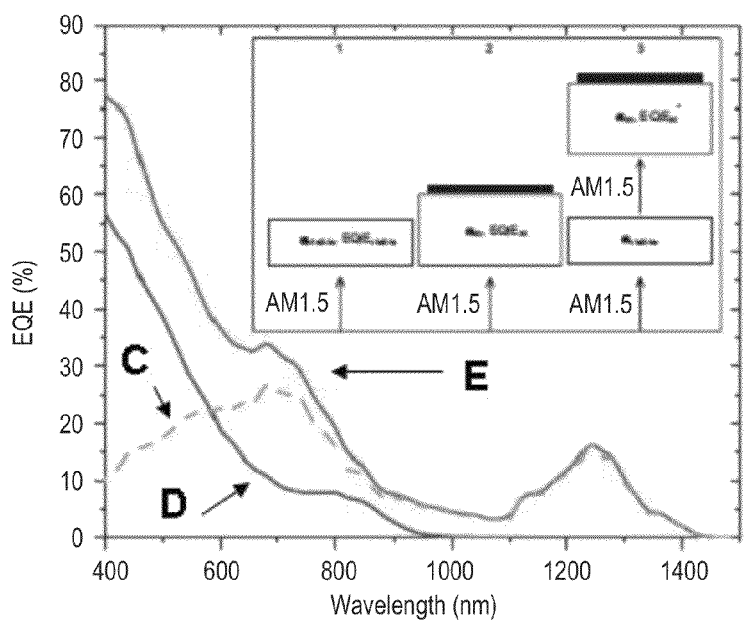
FIG. 8c shows that the external quantum efficiency spectra of the large-bandgap junction with a transparent top contact, line D, the small-bandgap with a reflective top contact, line E, and the small-bandgap junction with the large-bandgap CQD film blocking the light, line C. The inset corresponds to three illumination conditions. When the large-bandgap CQD film blocks the incoming light, the estimated Jsc of the small-bandgap junction is matched to the Jsc of the large-bandgap junction.
Figure 9:
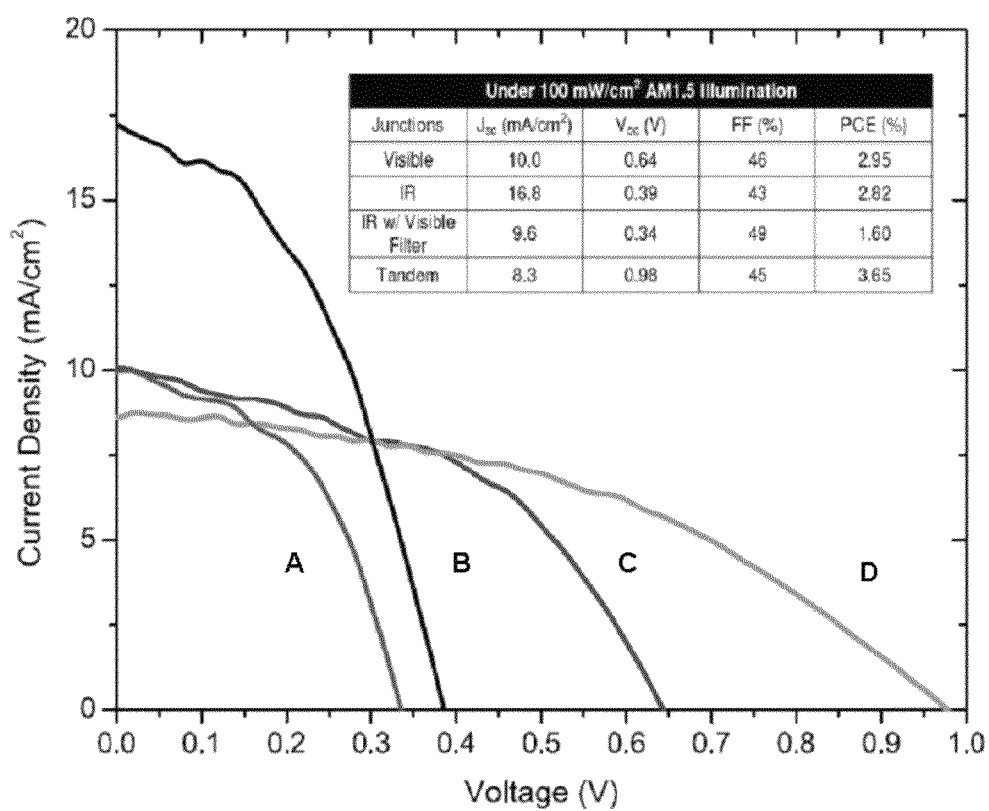
FIG. 9 shows the current-voltage characteristics of single junction and the tandem photovoltaic devices under AM1.5 1 sun simulated illumination. The large-bandgap junction PV, line C, shows Jsc=10.0 mA/cm$^2$, Voc=0.64 V, FF=46%, and PCE=2.95%; the small-bandgap junction PV, line B, shows Jsc=16.8 mA/cm$^2$, Voc=0.39 V, FF=43%, and PCE=2.82%. When the large-bandgap CQD film is used as a filer, the small-bandgap junction PV, line A, shows Jsc=9.6 mA/cm$^2$, Voc=0.34 V, FF=49%, and PCE=1.60%. The double junction PV, line D, shows Jsc=8.3 mA/cm$^2$, Voc=0.98 V, FF=45%, and PCE=3.65%.
Figure 10A:
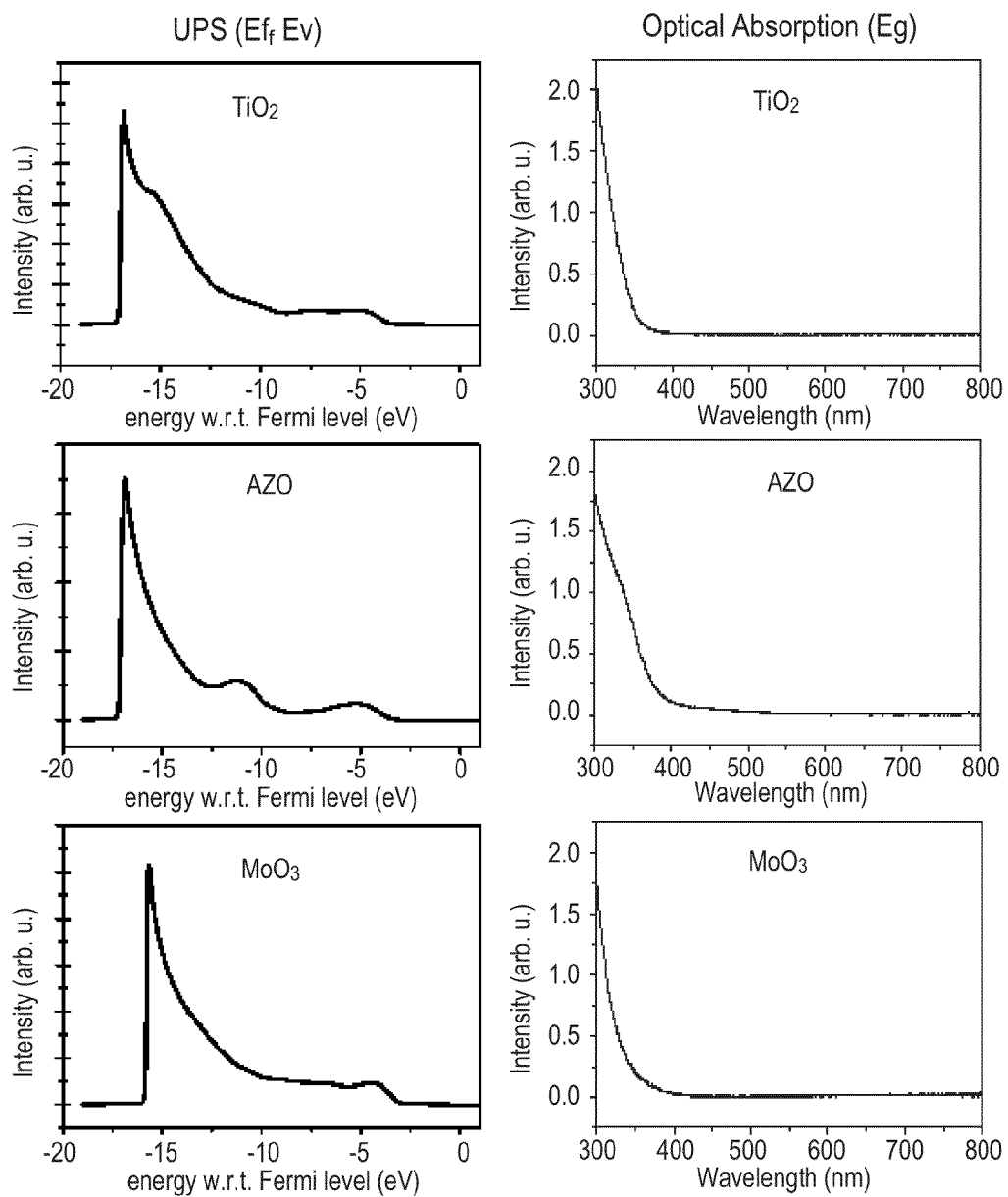
FIG. 10a shows the UPS results of MoO$_3$, AZO and TiO$_3$; film optical absorption of MoO$_3$, AZO and TiO$_3$; cyclic voltammetry results of AZO and TiO$_3$; FET results of MoO$_3$, AZO and TiO$_3$.
Figure 10A:
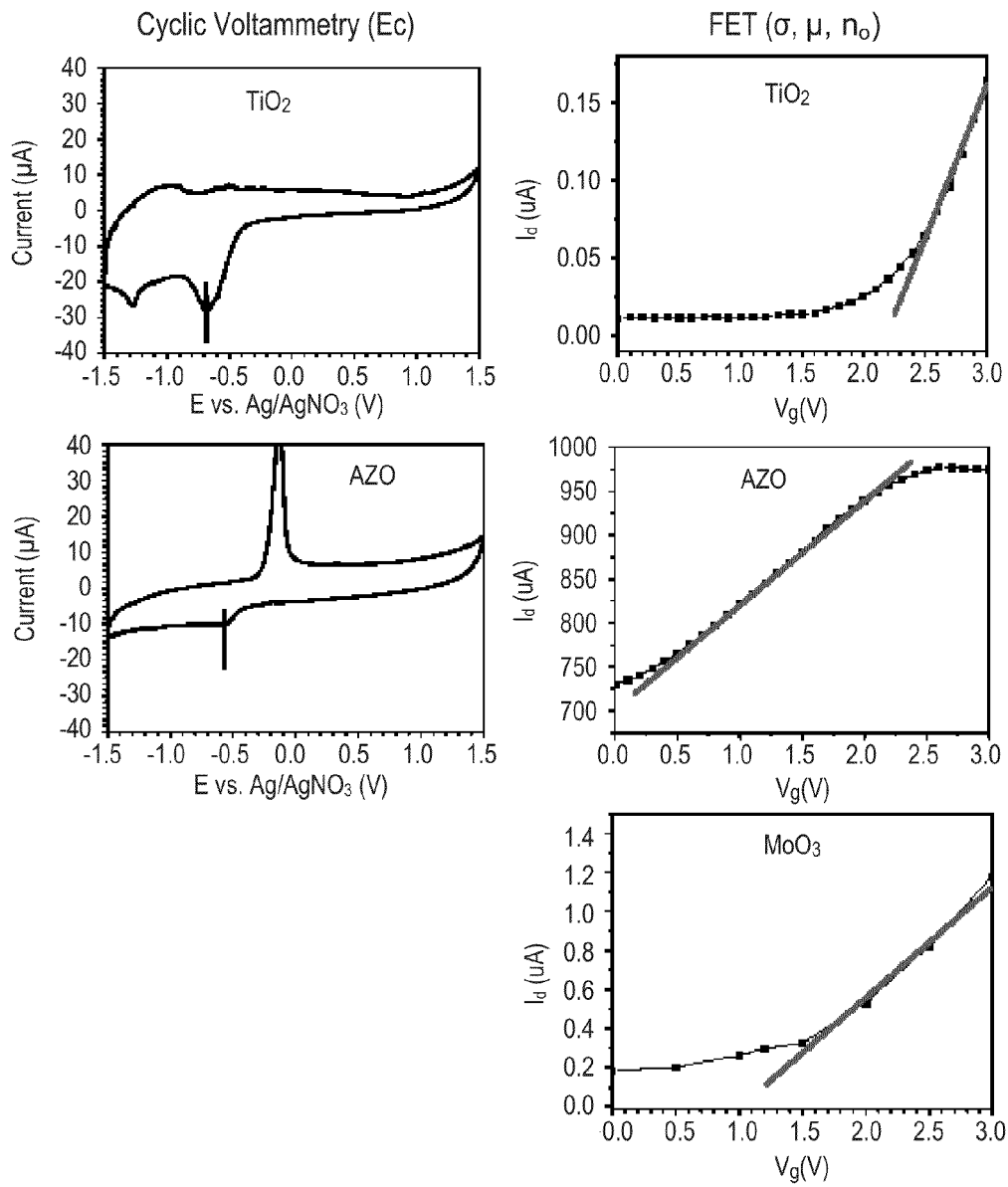
Figures 10B, 10C:
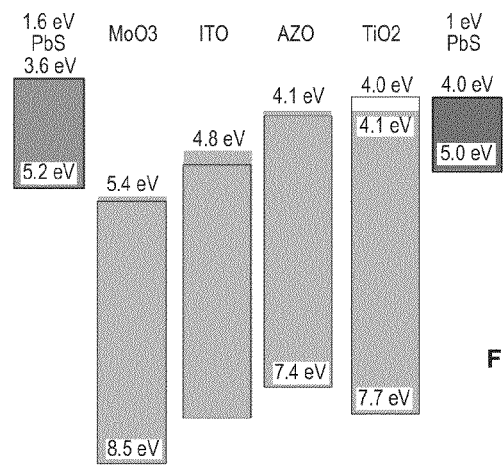
FIG. 10b is a table summarizing the optical and electrical properties of the GRL constituent materials employed.
FIG. 10c is an energy level diagram showing the HOMO and LUMO energies of each type of PbS quantum dots, and the band edges of the isolated GRL materials.

The conductivities of ITO and AZO are obtained by measuring resistance of 100 nm thick ITO and AZO films (1 inch by 1 inch in size). The resistance of $TiO_2$ is too high to be obtained with this approach. We first deposit 30 nm thick $TiO_2$ film on a clean substrate, and then put patterned Ag as electrodes as illustrated in FIG. 6. The resistance of $TiO_2$ film between two close Ag electrodes is measured. Equation 1 below describes the resistance of the $TiO_2$ film. The conductivity of $TiO_2$ is extracted from the inset in FIG. 4a.

$$R=(1/\sigma)\cdot(1/d)\cdot(1/W) \qquad \text{Equation I}$$

EXAMPLE 4

This example illustrates the preparation of a multijunction energy-converting device which includes two photovoltaic junctions with a graded recombination layer therebetween including indium tin oxide, aluminum-doped zinc oxide, and titanium dioxide.

PbS colloidal quantum dots were synthesized using a variation on the method described by Hines, M et al. in "Colloidal PbS nanocrystals with size-tunable near-infrared emission: observation of post-synthesis self-narrowing of the particle size distribution." *Adv. Mater.* 15, 1844-1849 (2003). $SnO_2$:F-coated glass substrates (1 inch by 1 inch) were used as the transparent bottom contact. $TiO_2$ in each p-n heterojunction has a thickness of 80 nm and was deposited at room temperature by RF magnetron sputtering in an inert argon (Ar) environment at a pressure of 5 mTorr, a power of 95 W, and a rate of 0.2 $As^{-1}$. Quantum dot films were prepared on $TiO_2$ by multilayer spincoating a 50 mg $mL^{-1}$ solution in octane under ambient conditions. Each layer (25 nm thick) was deposited at 2500 rpm and treated briefly with 10% 3-mercaptopropionic acid (MPA) in methanol. Thereafter, each layer was rinsed with methanol and octane. After fabrication of each p-n heterojunction, the device was transferred to a glove box with a nitrogen ($N_2$) atmosphere and left overnight. The GRL (a circular shape of 2.78 mm in diameter) was deposited at room temperature by RF magnetron sputtering. ITO (50 nm thick) was deposited in Ar environment at a pressure of 5 mTorr, a power of 35 W, and a rate of 0.25 $As^{-1}$. AZO (80 nm thick) was deposited in Ar environment at a pressure of 5 mTorr, a power of 59 W, and a rate of 0.25 $As^{-1}$. $TiO_2$ (10 nm thick) was deposited in Ar environment at a pressure of 5 mTorr, a power of 95 W, and a rate of 0.20 $As^{-1}$. Gold top contacts (circular shape of 2 mm in diameter), 100 nm thick, were deposited with the same sputter.

J-V data was measured using a Keithley 2400 source-meter under ambient conditions. The illumination source was a 975 nm diode laser.

Absorption spectroscopy was carried out on a Cary 500 UV-Vis-IR Scan spectrophotometer. Scanning electron microscopy was performed on a cross cut sample.

The PbS colloidal quantum dot films have a confined bandgap of 1.3 eV. $TiO_2$ is a lightly n-type transparent conductive oxide that generates a built-in field at the junction with the p-type PbS colloidal quantum dot film. The junction favors electron injection from the quantum dot film into the $TiO_2$ because of an approximate 0.3 eV band offset. As a consequence of this band offset, the electron-hole pairs generated in the colloidal quantum dot film are separated, through the action of the depletion region and the heterointerface, such that electrons flow to the $TiO_2$ and holes flow to the ohmic contact in the case of the basic single junction device.

The means of fabrication of each of the constituent cells has previously been reported by Pattantyus-Abraham, A. G. et al. in "Depleted-heterojunction colloidal quantum dot solar Cells," *ACS Nano*, 4 (6), pp 3374-3380, (2010). All of these materials are deposited using room-temperature sputtering compatible with the colloidal quantum dot films.

In order to simplify current matching, the tandem photovoltaic device was fabricated so that the two light-absorbing layers were of similar thickness. Also, the device was illuminated with 975 nm wavelength light, for which the fractional absorption in each colloidal quantum dot layer is small. This design achieved approximate current matching.

A tandem photovoltaic device was fabricated wherein a three-layer graded recombination layer was between the pair of photovoltaic junctions. In this architecture, a heavily n-type deep-work function indium tin oxide contacts the PbS colloidal quantum dot layer of the bottom cell; there is an intermediate-work function aluminum-doped zinc oxide layer that also provides an intermediate carrier density between the indium tin oxide layer and the third layer of the graded recombination layer which is a more lightly-doped n-type $TiO_2$. The more lightly-doped n-type $TiO_2$ contacts the $TiO_2$ of the other of the pair of adjacent photovoltaic junctions.

In the claims appended hereto, the term "a" or "an" is intended to mean "one or more." The term "comprise" and variations thereof such as "comprises" and "comprising," when preceding the recitation of a step or an element, are intended to mean that the addition of further steps or elements is optional and not excluded. All patents, patent applications, and other published reference materials cited in this specification are hereby incorporated herein by reference in their entirety. Any discrepancy between any reference material cited herein or any prior art in general and an explicit teaching of this specification is intended to be resolved in favor of the teaching in this specification. This includes any discrepancy between an art-understood definition of a word or phrase and a definition explicitly provided in this specification of the same word or phrase.

Although the foregoing invention has been described in some detail by way of illustration and example for purposes of clarity of understanding, one of skill in the art will appreciate that certain changes and modifications may be practiced within the scope of the appended claims.

What is claimed is:

1. A multijunction energy-converting device comprising:
   (a) first and second electrodes,
   (b) a photovoltaic stack in electrical contact with said first and second electrodes and comprising a plurality of photovoltaic junctions, each said photovoltaic junction comprising an electron-accepting semiconductor layer and a light-absorbing semiconductor layer having a substantially larger work function than said electron-accepting semiconductor layer, said plurality of photovoltaic junctions comprising a first photovoltaic junction and a second photovoltaic junction that are separated by
   (c) a recombination region comprising a transparent and conductive hole-accepting layer in ohmic contact with said light-absorbing semiconductor layer of said first photovoltaic junction, a transparent and conductive electron-accepting layer in ohmic contact with said electron-accepting semiconductor layer of said second photovoltaic junction, and an additional transparent and conductive interlayer disposed between, and having a work function between, said transparent and conductive hole-accepting layer in ohmic contact with said light-absorbing semiconductor layer of said first photovoltaic junction and said transparent and conductive electron-accepting layer in ohmic contact with said electron-accepting semiconductor layer of said second photovoltaic junction;
said recombination region forming a gradient in work function from said transparent and conductive hole-accepting layer in ohmic contact with said light-absorbing semiconductor layer of said first photovoltaic junction to said transparent and conductive electron-accepting layer in ohmic contact with said electron-accepting semiconductor layer of said second photovoltaic junction, and having a thickness within one order of magnitude of the sum of the Debye lengths of all layers of said recombination region.

2. The device of claim 1 wherein said gradient work function decreases from a value within about 0.2 eV of the work function of said light-absorbing semiconductor layer to a value within about 0.2 eV of said electron-accepting semiconductor layer.

3. The device of claim 1 wherein said gradient work function is a stepwise gradient having at least two steps.

4. The device of claim 1 wherein said gradient work function is a stepwise gradient having exactly three steps.

5. The device of claim 1 wherein said gradient work function is a stepwise gradient having exactly four steps.

6. The device of claim 1, wherein each of said layers of said recombination region, independently in each instance, has a thickness of about 1 nm to about 100 nm.

7. The device of claim 1, wherein each of said layers of said recombination region, independently in each instance, has a thickness of about 1 nm to about 60 nm.

8. The device of claim 1, wherein each of said layers of said recombination region, independently in each instance, have a thickness of about 5 nm to about 50 nm.

9. The device of claim 1, wherein each of said layers of said recombination region, independently in each instance, have a thickness of about 10 nm to about 50 nm.

10. The device of claim 1, where said recombination region comprises molybdenum trioxide, indium tin oxide, aluminum-doped zinc oxide, and titanium dioxide.

11. The device of claim 10, wherein the thickness of the molybdenum trioxide, indium tin oxide, aluminum zinc oxide, and titanium dioxide is about 10 nm, about 50 nm, about 50 nm, and about 40 nm, respectively.

12. The device of claim 1 wherein each of said layers of said recombination region, independently in each instance, has a uniform work function, and wherein each of said layers of said recombination region are arranged such that said work functions decrease from said transparent and conductive hole-accepting layer in ohmic contact with said light-absorbing semiconductor layer of said first photovoltaic junction toward said transparent and conductive electron-accepting layer in ohmic contact with said electron-accepting semiconductor layer of said second photovoltaic junction.

13. The device of claim 1 wherein said electron-accepting semiconductor layer of said second photovoltaic junction is an n-type material selected from the group consisting of titanium dioxide, zinc oxide, niobium oxide, $CuInSe_2$, $CuGaSe_2$, AlInGaP, GaAs, a-SiGe, and a-Si.

14. The device of claim 1 wherein said light-absorbing semiconductor layer of said first photovoltaic junction comprises p-type light-absorbing nanoparticles.

15. The device of claim 14 wherein said p-type light-absorbing nanoparticles are metal chalcogenide colloidal quantum dots.

16. The device of claim 14 wherein said p-type light absorbing nanoparticles are colloidal quantum dots selected from the group consisting of PbS, PbSe, PbSSe, CdS, CdSe, and CdTe.

17. The device of claim 14 wherein said p-type light-absorbing nanoparticles are lead chalcogenide colloidal quantum dots.

18. The device of claim 1 wherein said electron-accepting semiconductor layer of said second photovoltaic junction comprises titanium dioxide, and wherein said light-absorbing semiconductor layer of said first photovoltaic junction comprises lead chalcogenide colloidal quantum dots.

19. The device of claim 1 wherein said photovoltaic stack contains a minimum of two and a maximum of fifteen of said photovoltaic junctions.

20. The device of claim 1 wherein said photovoltaic stack contains a minimum of two and a maximum of five of said photovoltaic junctions.

21. The device of claim 1 wherein said photovoltaic stack contains exactly two of said photovoltaic junctions.

22. The device of claim 1 wherein said photovoltaic stack contains exactly three of said photovoltaic junctions.

23. The device of claim 1 wherein said light-absorbing semiconductor layer of said first photovoltaic junction absorbs light of a first wavelength band, and wherein said light-absorbing semiconductor layer of said second photovoltaic junction absorbs light at wavelengths outside said first wavelength band.

24. The device of claim 1 wherein each of said photovoltaic junctions in said photovoltaic stack contains p-type light-absorbing nanoparticles that absorb light of wavelengths that are different from the wavelengths of light absorbed by p-type light-absorbing nanoparticles of any of the other photovoltaic junctions in said photovoltaic stack.

25. The device of claim 1 wherein said electron-accepting semiconductor layer of said second photovoltaic junction and said light-absorbing semiconductor layer of said first photovoltaic junction have bandgaps of different magnitudes to cause an electrical junction therebetween to be substantially depleted of free electrons and free holes when said electrical junction is not illuminated.

26. The device of claim 25 wherein said bandgap of said electron-accepting semiconductor layer of said second photovoltaic junction is greater than said bandgap of said light-absorbing semiconductor layer of said first photovoltaic junction by at least about 1.5 eV.

27. The device of claim 25 wherein said bandgap of said electron-accepting semiconductor layer of said second photovoltaic junction is greater than said bandgap of said light-absorbing semiconductor layer of said first photovoltaic junction by from about 1.5 eV to about 5 eV.

28. The device of claim 1, wherein said light-absorbing semiconductor layer of one of said first and second photovoltaic junctions absorbs light with wavelengths between about 400 nm and about 800 nm, and wherein said light-absorbing semiconductor layer of the other of said first and second photovoltaic junctions absorbs light with wavelengths between about 400 nm and about 1600 nm.

29. The device of claim 1, wherein said electron-accepting semiconductor layer of said second photovoltaic junction comprises an n-type metal oxide, wherein said light-absorbing semiconductor layer of said first photovoltaic junction comprises p-type nanoparticles having a substantially larger work function than said n-type metal oxide, and wherein at least one side of an electrical junction therebetween is substantially depleted of free electrons and free holes when said electrical junction is not illuminated.

30. The device of claim 1, wherein the specific conductance of the recombination region is greater than 1 Siemens/$cm^2$.

31. The device of claim 1, wherein the first electrode is selected from the group consisting of gold, molybdenum, fluorine-doped tin dioxide ($F:SnO_2$), indium tin oxide (ITO), indium tin oxide/poly(3,4-ethylene dioxythiophene) (ITO/PEDOT), n-type aluminum gallium arsenide (Al/n+-GaAs), and silver-containing indium tin oxide (Ag/ITO).

32. The device of claim 1, wherein the second electrode is selected from the group consisting of gold, silver, aluminum, aluminum doped zinc oxide (ZnO/Al), p-type silver gallium arsenide (p+-GaAs/Ag), and n-type silicon fluorine doped tin oxide (n+a-Si/$F:SnO_2$).

* * * * *